United States Patent
Yang et al.

(10) Patent No.: US 6,670,256 B2
(45) Date of Patent: Dec. 30, 2003

(54) METAL OXYNITRIDE CAPACITOR BARRIER LAYER

(75) Inventors: Sam Yang, Boise, ID (US); Vishnu K. Agarwal, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/940,824

(22) Filed: Aug. 28, 2001

(65) Prior Publication Data

US 2002/0022334 A1 Feb. 21, 2002

Related U.S. Application Data

(62) Division of application No. 09/484,815, filed on Jan. 18, 2000, now Pat. No. 6,417,537.

(51) Int. Cl.[7] .............................................. H01L 21/20
(52) U.S. Cl. .................. 438/396; 438/397; 438/244; 438/253
(58) Field of Search ................... 438/396, 397, 438/398, 399, 393, 387, 239, 244, 253, 255

(56) References Cited

U.S. PATENT DOCUMENTS

| | | | |
|---|---|---|---|
| 5,070,036 A | 12/1991 | Stevens | 437/190 |
| 5,381,302 A | 1/1995 | Sandhu et al. | 361/305 |
| 5,392,189 A | 2/1995 | Fazan et al. | 361/305 |
| 5,406,447 A | 4/1995 | Miyazaki | 301/313 |
| 5,478,772 A | 12/1995 | Fazan | 437/60 |
| 5,506,166 A | 4/1996 | Sandhu et al. | 437/60 |
| 5,520,992 A | 5/1996 | Douglas et al. | 428/209 |
| 5,618,746 A | 4/1997 | Hwang | 438/3 |
| 5,625,233 A | 4/1997 | Cabral, Jr. et al. | 257/771 |
| 5,661,072 A | 8/1997 | Jeng | 438/439 |
| 5,663,088 A | 9/1997 | Sandhu et al. | 438/396 |

(List continued on next page.)

FOREIGN PATENT DOCUMENTS

WO 96/36993 11/1996 ........... H01L/21/70

OTHER PUBLICATIONS

Liu, W., et al., "Low–Temperature Fabrication of Amorphous BaTiO3 Thin–Film Bypass Capacitors", *IEEE Electron Device Letters*, 14, New York, 320–322, (Jul., 1993).

Yamamichi, S., et al., "A stacked capacitor technology with ECR plasma MOCVD (Ba, Sr)TiO3 and RuO2, Ru/TiN/TiSix storage nodes for Gb–Scale DRAM's", *IEEE Transactions on Electron Devices*, 44(7), pp. 1076–1083, (Jul. 1997).

(List continued on next page.)

*Primary Examiner*—Kevin M. Picardat
(74) *Attorney, Agent, or Firm*—Schwegman, Lundberg, Woessner & Kluth, P.A.

(57) ABSTRACT

Capacitor structures for use in integrated circuits and methods of their manufacture. The capacitor structures include a bottom electrode, a top electrode and a dielectric layer interposed between the bottom electrode and the top electrode. The capacitor structures further include a metal oxynitride barrier layer interposed between the dielectric layer and at least one of the bottom and top electrodes. Each metal oxynitride barrier layer acts to reduce undesirable oxidation of its associated electrode. Each metal oxynitride barrier layer can further aid in the repairing of oxygen vacancies in a metal oxide dielectric. The capacitors are suited for use as memory cells and apparatus incorporating such memory cells, as well as other integrated circuits.

43 Claims, 15 Drawing Sheets

U.S. PATENT DOCUMENTS

| | | | | |
|---|---|---|---|---|
| 5,665,628 A | | 9/1997 | Summerfelt | 438/3 |
| 5,707,898 A | | 1/1998 | Keller et al. | 438/265 |
| 5,708,302 A | | 1/1998 | Azuma et al. | 257/751 |
| 5,726,471 A | | 3/1998 | Keller et al. | 257/316 |
| 5,729,054 A | | 3/1998 | Summerfelt et al. | 257/751 |
| 5,744,832 A | | 4/1998 | Wolters et al. | 257/295 |
| 5,759,881 A | | 6/1998 | Manning | 438/199 |
| 5,773,314 A | | 6/1998 | Jiang et al. | 438/3 |
| 5,780,891 A | | 7/1998 | Kauffman et al. | 257/316 |
| 5,828,092 A | | 10/1998 | Tempel | 257/295 |
| 5,851,896 A | | 12/1998 | Summerfelt | 438/396 |
| 5,858,851 A | * | 1/1999 | Yamagata et al. | 438/396 |
| 5,859,760 A | | 1/1999 | Park et al. | 361/313 |
| 5,874,770 A | * | 2/1999 | Saia et al. | 257/536 |
| 5,925,918 A | | 7/1999 | Wu et al. | 257/413 |
| 5,939,741 A | | 8/1999 | Clampitt et al. | 257/278 |
| 5,949,117 A | | 9/1999 | Sandhu et al. | 257/410 |
| 5,959,327 A | | 9/1999 | Sandhu et al. | 257/310 |
| 5,970,309 A | | 10/1999 | Ha et al. | 438/3 |
| 5,980,977 A | | 11/1999 | Deng et al. | 427/79 |
| 5,985,719 A | | 11/1999 | Keller et al. | 438/265 |
| 5,998,290 A | | 12/1999 | Wu et al. | 438/595 |
| 6,030,847 A | | 2/2000 | Fazan et al. | 438/3 |
| 6,066,528 A | | 5/2000 | Fazan et al. | 438/253 |
| 6,069,059 A | | 5/2000 | Pan et al. | 438/451 |
| 6,075,274 A | | 6/2000 | Wu et al. | 257/413 |
| 6,080,672 A | | 6/2000 | Juengling et al. | 438/692 |
| 6,087,263 A | | 7/2000 | Clampitt et al. | 438/700 |
| 6,090,670 A | | 7/2000 | Sandhu et al. | 438/286 |
| 6,201,276 B1 | * | 3/2001 | Agarwal et al. | 257/315 |
| 6,207,489 B1 | * | 3/2001 | Nam et al. | 438/396 |
| 6,348,420 B1 | | 2/2002 | Raaijmakers et al. | 438/769 |
| 2002/0056864 A1 | | 5/2002 | Agarwal | 257/296 |

\* cited by examiner

METAL OXYNITRIDE CAPACITOR BARRIER LAYER

CROSS-REFERENCE TO RELATED APPLICATIONS

This application is a Divisional of U.S. application Ser. No. 09/484,815 filed Jan. 18, 2000, now U.S. Pat. No. 6,417,537, the specification of which is incorporated herein by reference.

TECHNICAL FIELD

The present invention relates generally to barrier layers in semiconductor capacitors, and in particular to development of semiconductor capacitor structures having at least one metal oxynitride barrier layer, and apparatus making use of such capacitor structures.

BACKGROUND

Many electronic systems include a memory device, such as a Dynamic Random Access Memory (DRAM), to store data. A typical DRAM includes an array of memory cells. Each memory cell includes a capacitor that stores the data in the cell and a transistor that controls access to the data. The capacitor typically includes two conductive electrodes separated by a dielectric layer. The charge stored across the capacitor is representative of a data bit and can be either a high voltage or a low voltage. Data can be either stored in the memory cells during a write mode, or data may be retrieved from the memory cells during a read mode. The data is transmitted on signal lines, referred to as digit lines, which are coupled to input/output (I/O) lines through transistors used as switching devices. Typically, for each bit of data stored, its true logic state is available on an I/O line and its complementary logic state is available on an I/O complement line. However, each such memory cell is coupled to, or associated with, only one digit line of a digit line pair through an access transistor.

Typically, the memory cells are arranged in an array and each cell has an address identifying its location in the array. The array includes a configuration of intersecting conductive lines, and memory cells are associated with the intersections of the lines. In order to read from or write to a cell, the particular cell in question must be selected, or addressed. The address for the selected cell is represented by input signals to a word line or row decoder and to a digit line or column decoder. The row decoder activates a word line in response to the word line address. The selected word line activates the access transistors for each of the memory cells in communication with the selected word line. The column decoder selects a digit line pair in response to the digit line address. For a read operation, the selected word line activates the access transistors for a given word line address, the charge of the selected memory cells are shared with their associated digit lines, and data is sensed and latched to the digit line pairs.

As DRAMs increase in memory cell density, there is a continuing challenge to maintain sufficiently high storage capacitance despite decreasing memory cell area and its accompanying capacitor area, since capacitance is generally a function of electrode area. Additionally, there is a continuing goal to further decrease memory cell area.

A principal method of increasing cell capacitance is through cell structure techniques. Such techniques include three-dimensional cell capacitors, such as trenched or stacked capacitors. One common form of stacked capacitor structure is a cylindrical container stacked capacitor, with a container structure forming the bottom electrode of the capacitor. Such container structures may have shapes differing from a substantially cylindrical form, such as an oval or other three-dimensional container. The container structures may further incorporate fins.

Another method of increasing cell capacitance is through the use of high dielectric constant material in the dielectric layer of the capacitor. In order to achieve the charge storage efficiency generally needed in 256 megabit (Mb) memories and above, materials having a high dielectric constant, and typically dielectric constants greater than 50, can be used in the dielectric layer between the bottom electrode and the top electrode of the capacitor. The dielectric constant is a characteristic value of a material and is generally defined as the ratio of the amount of charge that can be stored in the material when it is interposed between two electrodes relative to the charge that can be stored when the two electrodes are separated by a vacuum.

Unfortunately, high dielectric constant materials are often incompatible with existing processes. One cause of such incompatibility can be the oxygen-containing ambient often present during the deposition of high dielectric constant materials or during subsequent annealing processes. Other causes of incompatibility may be adverse chemical reactions or oxygen diffusion between the material of the dielectric layer and the material of an adjoining electrode due to direct contact.

For the reasons stated above, and for other reasons stated below which will become apparent to those skilled in the art upon reading and understanding the present specification, there is a need in the art for alternative capacitor structures and methods of producing same.

SUMMARY

Embodiments of the invention include capacitors having a metal oxynitride barrier layer interposed between an electrode and a dielectric layer, and methods of their formation. The metal oxynitride barrier layer acts to reduce undesirable oxidation of its associated electrode. The metal oxynitride barrier layer can further aid in the repairing of oxygen vacancies in a metal oxide dielectric layer.

For one embodiment, the invention includes a capacitor. The capacitor includes a bottom electrode, a top electrode and a dielectric layer interposed between the bottom electrode and the top electrode. The capacitor further includes at least one metal oxynitride barrier layer. Each metal oxynitride barrier layer is interposed between the dielectric layer and either the bottom electrode or the top electrode.

For another embodiment, the invention includes a capacitor. The capacitor includes a bottom electrode, a top electrode and a dielectric layer interposed between the bottom electrode and the top electrode. The capacitor further includes a metal oxynitride barrier layer interposed between the dielectric layer and the bottom electrode. The capacitor still further includes a metal oxynitride barrier layer interposed between the dielectric layer and the top electrode.

For a further embodiment, the invention includes a capacitor. The capacitor includes a bottom electrode, a top electrode and a metal oxide dielectric layer interposed between the bottom electrode and the top electrode. The capacitor further includes at least one metal oxynitride barrier layer. Each metal oxynitride barrier layer is interposed between the dielectric layer and either the bottom electrode or the top electrode. For one embodiment, the bottom electrode, the top electrode or both electrodes contain metal nitride. For another embodiment, the dielectric layer contains at least one metal oxide dielectric material selected from the group consisting of $Ba_zSr_{(1-z)}TiO_3$ [BST; where $0<z<1$], $BaTiO_3$, $SrTiO_3$, $PbTiO_3$, $Pb(Zr,Ti)O_3$ [PZT], $(Pb,La)(Zr,Ti)O_3$ [PLZT], $(Pb,La)TiO_3$ [PLT], $Ta_2O_5$, $KNO_3$, $Al_2O_3$ and $LiNbO_3$. For yet another embodiment, the metal oxynitride barrier layer contains a metal oxynitride having a composition of the form $MO_xN_y$. The metal component M may be a refractory metal. The refractory metals of chromium (Cr), cobalt (Co), hafnium (Hf), molybdenum (Mo), niobium (Nb), tantalum (Ta), titanium (Ti), tungsten (W), vanadium (V) and zirconium (Zr) are included in this definition. For a further embodiment, the metal component M may be of the platinum metals group, such as iridium (Ir), osmium (Os), palladium (Pd), platinum (Pt), rhodium (Rh) or ruthenium (Ru), or the noble metals group, such as gold (Au), iridium, osmium, palladium, platinum, rhenium (Re), rhodium or ruthenium. For another embodiment, the metal component M is selected from the group consisting of chromium, cobalt, hafnium, iridium, molybdenum, niobium, osmium, rhenium, rhodium, ruthenium, tantalum, titanium, tungsten, vanadium and zirconium.

For one embodiment, the invention includes a capacitor. The capacitor includes a bottom electrode, a top electrode and a metal oxide dielectric layer interposed between the bottom electrode and the top electrode. The capacitor further includes a tungsten oxynitride barrier layer interposed between the dielectric layer and the bottom electrode. The capacitor still further includes a tungsten oxynitride barrier layer interposed between the dielectric layer and the top electrode. For another embodiment, the bottom and top electrodes contain tungsten nitride. For a further embodiment, the dielectric layer contains tantalum oxide.

For another embodiment, the invention includes a method of forming a capacitor. The method includes forming a bottom electrode layer, forming a first metal oxynitride barrier layer overlying the bottom electrode layer, forming a dielectric layer overlying the first metal oxynitride barrier layer, forming a second metal oxynitride barrier layer overlying the dielectric layer, and forming a top electrode layer overlying the second metal oxynitride barrier layer.

For still another embodiment, the invention includes a method of forming a capacitor. The method includes forming a bottom electrode layer, forming a metal oxynitride barrier layer overlying the bottom electrode layer, forming a dielectric layer overlying the metal oxynitride barrier layer, and forming a top electrode layer overlying the dielectric layer.

For yet another embodiment, the invention includes a method of forming a capacitor. The method includes forming a bottom electrode layer, forming a dielectric layer overlying the bottom electrode layer, forming a metal oxynitride barrier layer overlying the dielectric layer, and forming a top electrode layer overlying the metal oxynitride barrier layer.

Further embodiments of the invention include semiconductor structures and methods of varying scope, as well as apparatus, devices, modules and systems making use of such semiconductor structures and methods.

BRIEF DESCRIPTION OF THE DRAWINGS

FIGS. 2A–2J are cross-sectional views of a portion of the memory device of FIG. 1 at various processing stages.

DESCRIPTION OF THE EMBODIMENTS

In the following detailed description of the preferred embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

The following description will be illustrated in the context of semiconductor container capacitors, and in particular, container capacitor memory cells for dynamic memory devices. It will be apparent to those skilled in the art that other capacitor structures, e.g., trench capacitors and parallel plate capacitors, are suitable for use with the various embodiments of the invention. It will further be apparent to those skilled in the art that the capacitor structures described herein and their methods of fabrication can be adapted to a variety of integrated circuit devices and applications. Accordingly, the capacitor structures described herein are not limited to the example embodiments.

Figure 1:
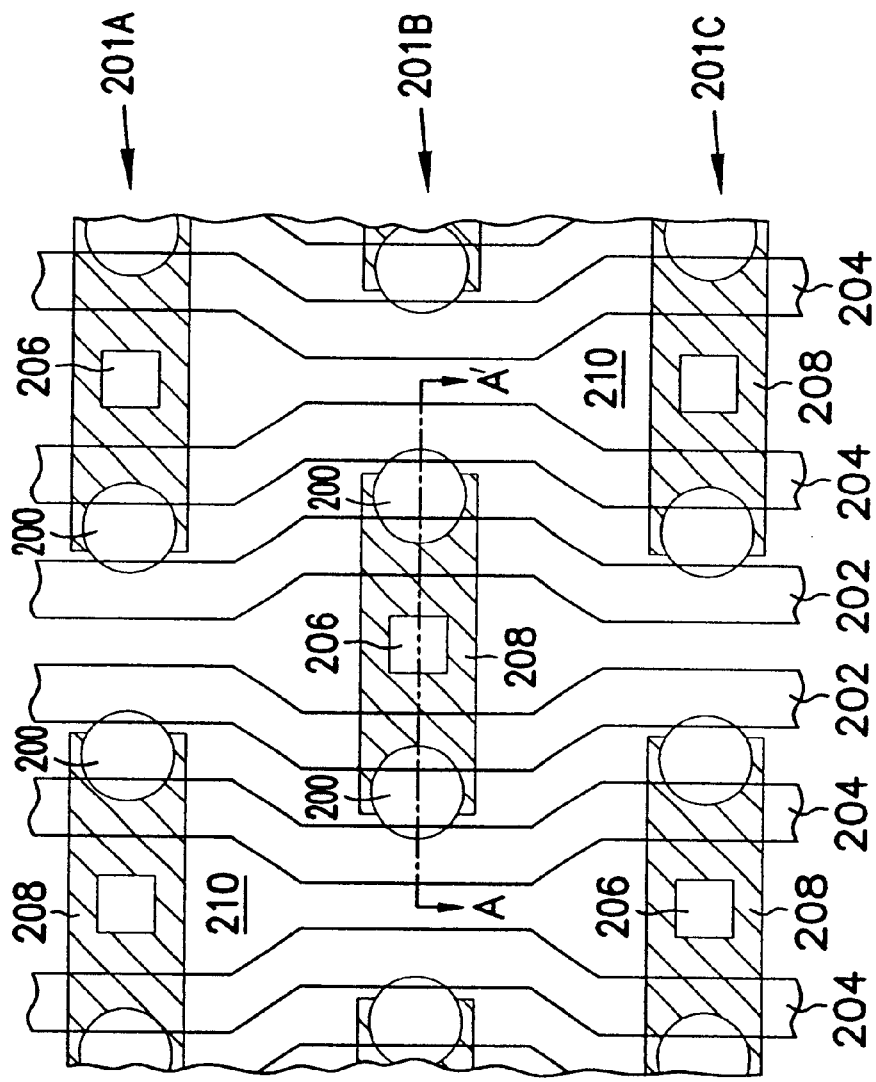
FIG. 1 is an elevation view of a layout of a portion of a memory array of a memory device.

FIG. 1 depicts the general layout of a portion of a memory array of a memory device in accordance with one embodiment of the invention. The memory array includes container capacitor memory cells 200 formed overlying active areas 208. Active areas 208 are separated by field isolation regions 210. Active areas 208 and field isolation regions 210 are formed overlying a semiconductor substrate.

The memory cells 200 are arrayed substantially in rows and columns. Shown in FIG. 1 are portions of three rows 201A, 201B and 201C. Separate digit lines (not shown) would be formed overlying each row 201 and coupled to active areas 208 through digit line contacts 206. Word lines 202 and 204 are further coupled to active areas 208, with word lines 202 coupled to active areas 208 in row 201B and word lines 204 coupled to active areas 208 in rows 201A and 201C. The word lines 202 and 204, coupled to memory cells in this alternating fashion, generally define the columns of the memory array. This folded bit-line architecture is well known in the art for permitting higher densification of memory cells 200.

FIGS. 2A–2J depict one embodiment of a portion of the processing to fabricate the memory device of FIG. 1. FIGS. 2A–2J are cross-sectional views taken along line A–A' of FIG. 1 during various processing stages.

Figure 2A:
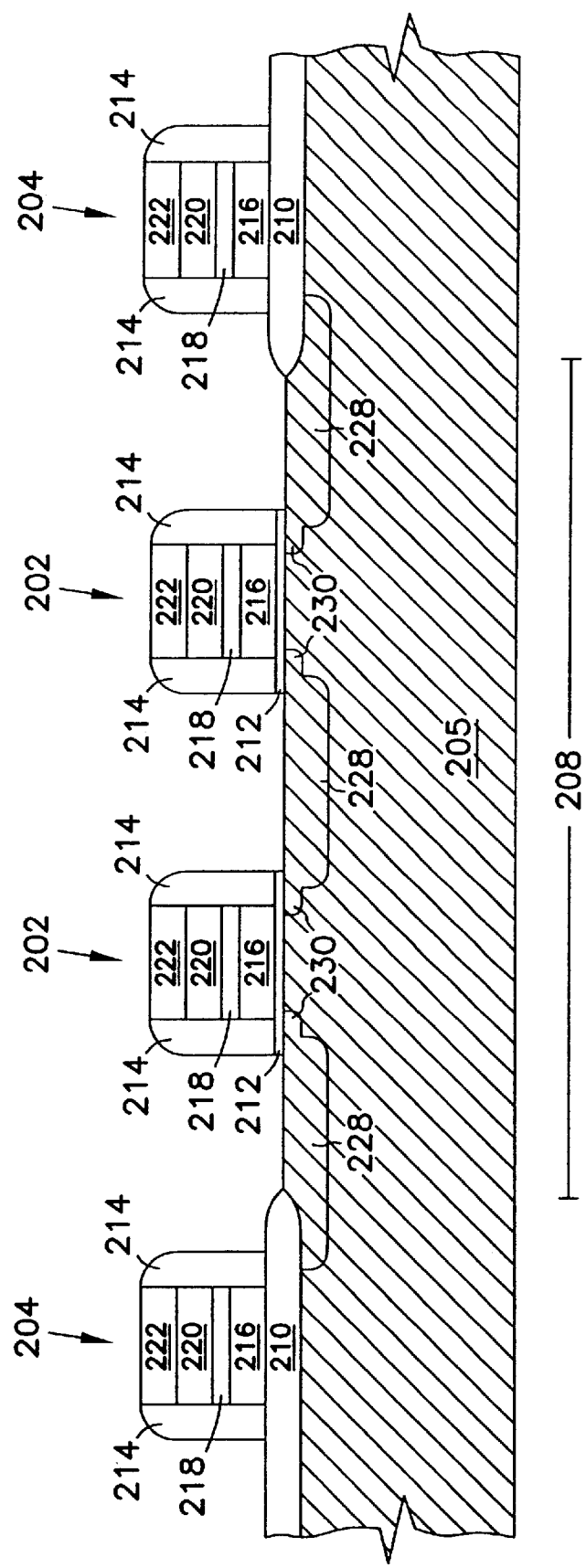

In FIG. 2A, field isolation regions 210 are formed on a substrate 205. Substrate 205 may be a silicon substrate, such as a P-type silicon substrate. Field isolation regions 210 are generally formed of an insulator material, such as silicon oxides, silicon nitrides or silicon oxynitrides. For this embodiment, field isolation regions 210 are formed of silicon dioxide such as by conventional local oxidation of silicon (LOCOS) which creates substantially planar regions of oxide on the substrate surface. Active areas 208 are those areas not covered by the field isolation regions 210 on substrate 205. The creation of the field isolation regions 210 is preceded or followed by the formation of a gate dielectric layer 212. For this embodiment, gate dielectric layer 212 is a thermally grown silicon dioxide, but may be other insulator materials described herein or known in the art.

Following the creation of the field isolation regions 210 and gate dielectric layer 212, a first conductively doped gate polysilicon layer 216, a gate barrier layer 218, a gate conductor layer 220, a gate cap layer 222 and gate spacers 214 are formed by methods well known in the art. Gate barrier layer 218 may be a metal nitride, such as titanium nitride or tungsten nitride. Gate conductor layer 220 may be any conductive material and is increasingly metal. Gate cap layer 222 is often silicon nitride while gate spacers 214 are generally of an insulator material such as silicon oxide, silicon nitride and silicon oxynitride. The foregoing layers are patterned to form word lines 202 and 204 as gates for field effect transistors (FET). The construction of the word lines 202 and 204 are illustrative only. As a further example, the construction of the word lines 202 and 204 may include a refractory metal silicide layer overlying a polysilicon layer. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals. Other constructions for word lines 202 and 204 are well known in the art.

Source/drain regions 228 are formed in the substrate 205 such as by conductive doping of the substrate. Source/drain regions have a conductivity opposite the substrate 205. For a P-type substrate, source/drain regions 228 would have an N-type conductivity. Such conductive doping may be accomplished through ion implantation of phosphorus or arsenic for this embodiment. As is often the case, source/drain regions 228 include lightly-doped regions 230 created by differential levels of ion concentration or even differing dopant ions. Word lines 202 and 204 are adapted to be coupled to periphery contacts (not shown). The periphery contacts are located at the end of the memory array and are adapted for electrical communication with external circuitry.

The formation of the word lines 202 and 204 as described are exemplary of one application to be used in conjunction with various embodiments of the invention. Other methods of fabrication and other applications are also feasible and perhaps equally viable. For clarity and to focus on the formation of the capacitor structures, many of the reference numbers are eliminated from subsequent drawings, e.g., those pertaining to the structure of the word lines and the source/drain regions.

Figure 2B:
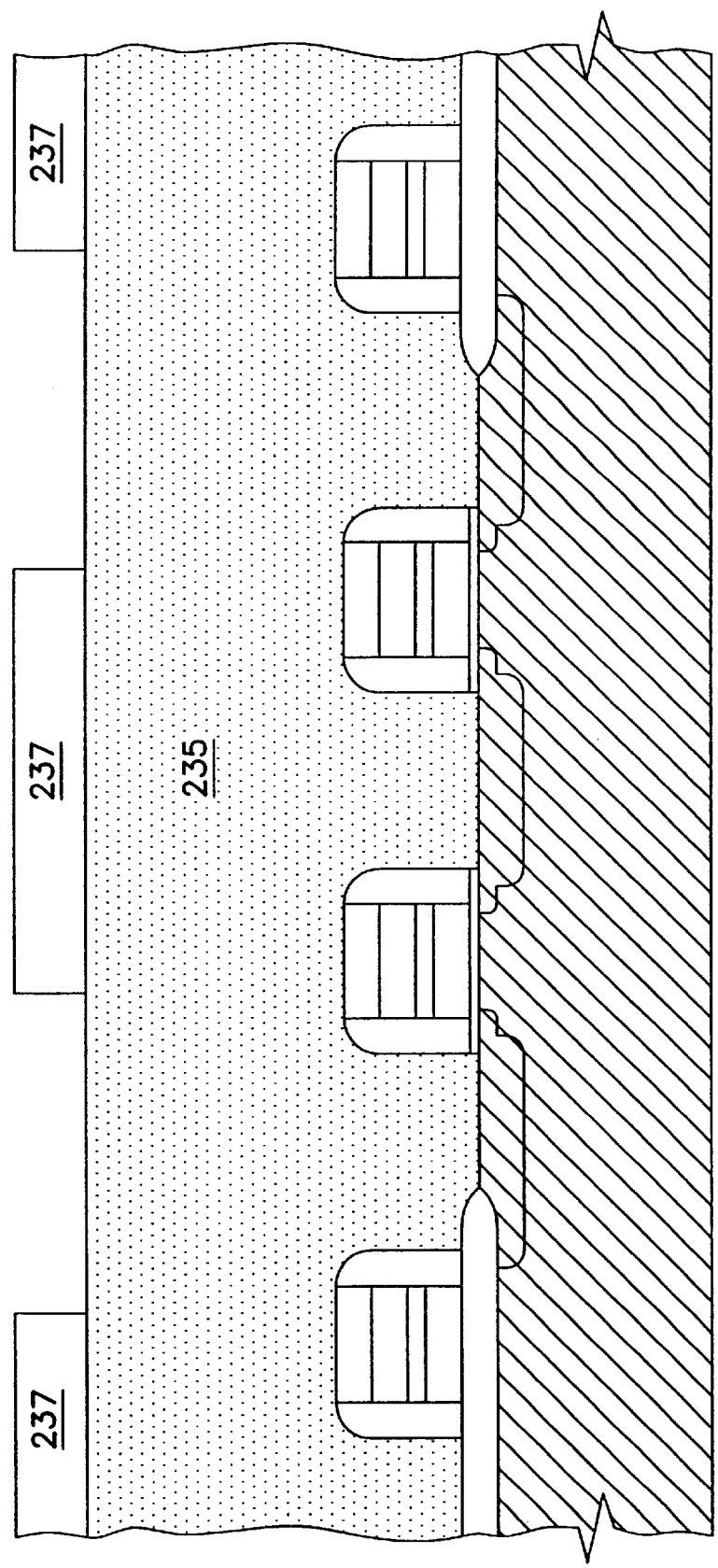

In FIG. 2B, a thick insulating layer 235 is deposited overlying substrate 205, as well as word lines 202 and 204, field isolation regions 210 and active areas 208. Insulating layer 235 is an insulator material such as silicon oxide, silicon nitride and silicon oxynitride materials. For one embodiment, insulating layer 235 is a doped insulator material such as borophosphosilicate glass (BPSG), a boron and phosphorous-doped silicon oxide. The insulating layer 235 is planarized, such as by chemical-mechanical planarization (CMP), in order to provide a uniform height. A mask 237 is formed overlying insulating layer 235 and patterned to define future locations of the memory cells 200.

Figure 2C:
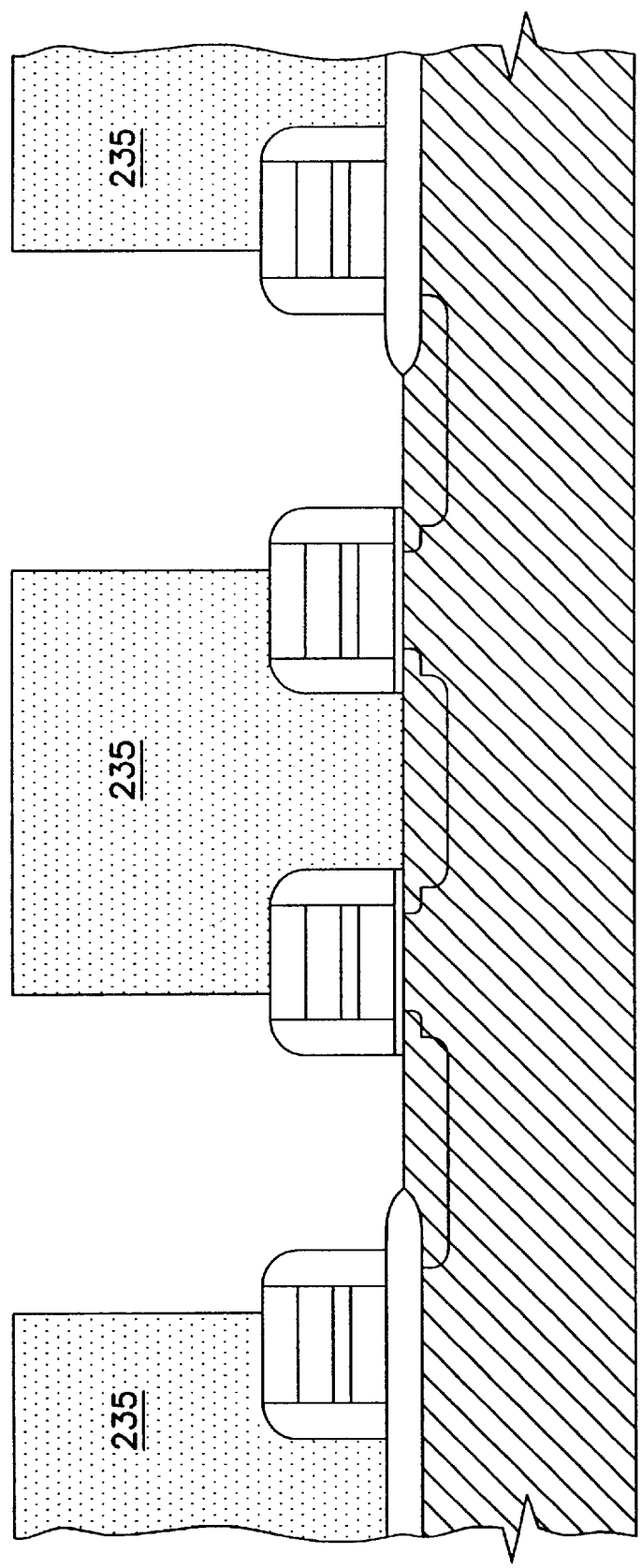

In FIG. 2C, portions of insulating layer 235 exposed by patterned mask 237 are removed and mask 237 is subsequently removed. The portions of insulating layer 235 may be removed by etching or other suitable removal technique known in the art. Removal techniques are generally dependent upon the material of construction of the layer to be removed as well as the surrounding layers to be retained. Patterning of insulating layer 235 creates openings having bottom portions overlying exposed portions of the substrate 205 and sidewalls defined by the insulating layer 235.

Figure 2D:
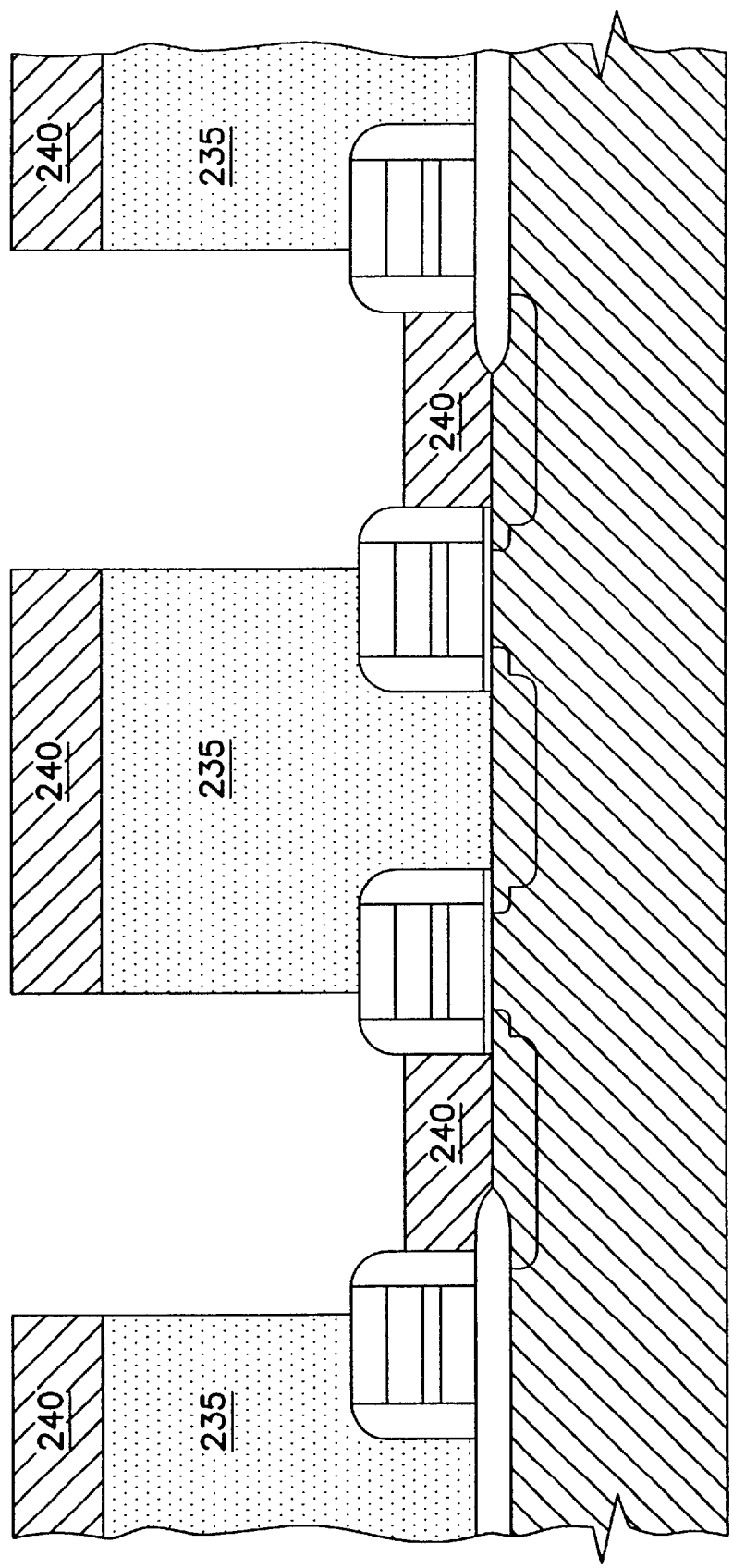

In FIG. 2D, a layer of doped polysilicon is formed overlying exposed portions of active area 208 and top portions of insulating layer 235 to form contact layer 240. Contact layer 240 may be formed by controlled deposition of polysilicon as shown in FIG. 2D. Alternatively, contact layer 240 may be blanket deposited polysilicon followed by an etch-back to leave a layer of polysilicon overlying exposed portions of active area 208 between word lines 202 and 204. For still further embodiments, contact layer 240 is formed from tungsten, titanium nitride, tungsten nitrides, tantalum nitride, aluminum or other conductive materials, metals or alloys.

Figure 2E:
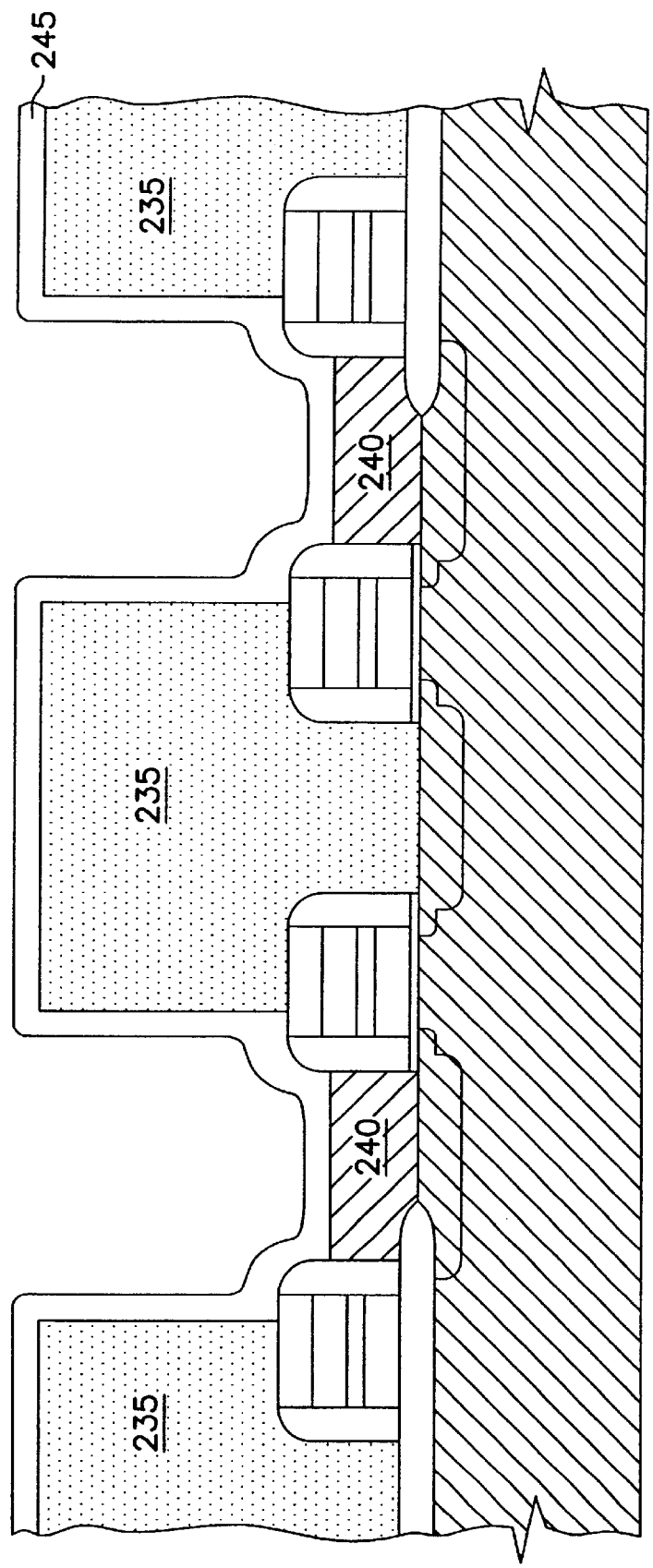

In FIG. 2E, portions of contact layer 240 overlying insulating layer 235 are removed to form contacts 240 between the word lines 202 and 204. A bottom electrode 245 is formed overlying the contacts 240 and insulating layer 235. Bottom electrode 245 is any conductive material. For one embodiment, bottom electrode 245 contains a metal nitride. For another embodiment, the metal component of the bottom electrode 245 is a refractory metal, resulting in a refractory metal nitride. For yet another embodiment, bottom electrode 245 contains tungsten nitride (WN$_n$; 0<n<=6). Bottom electrode 245 may contain more than one conductive layer, e.g., a metal nitride layer overlying a metal silicide layer. For additional embodiments, the conductive material of bottom electrode 245 contains a metal or conductive metal oxides, including platinum (Pt), titanium (Ti), ruthenium (Ru) and ruthenium oxide (RuO$_x$).

Bottom electrode 245 may be formed by any method, such as collimated sputtering, chemical vapor deposition (CVD) or other deposition techniques. In the case of a metal nitride material, bottom electrode 245 may be deposited as a metal layer followed by nitridation.

Bottom electrode 245 forms the bottom conductive layer or electrode of the capacitor. For one embodiment, the bottom conductive layer has a closed bottom and sidewalls extending up from the closed bottom as shown in FIG. 2E. For another embodiment, the bottom conductive layer has a substantially planar surface as in a parallel plate capacitor. Subsequent annealing of the memory device may produce a reaction between bottom electrode 245 and contact 240 such than an interface layer is formed. As an example, where bottom electrode 245 contains a refractory metal or refractory metal nitride, and contact 240 contains polysilicon, subsequent annealing can produce a refractory metal silicide interface between bottom electrode 245 and contact 240. Such metal silicide interface layers are often advantageous in reducing electrical resistance to contact 240.

Figure 2F:
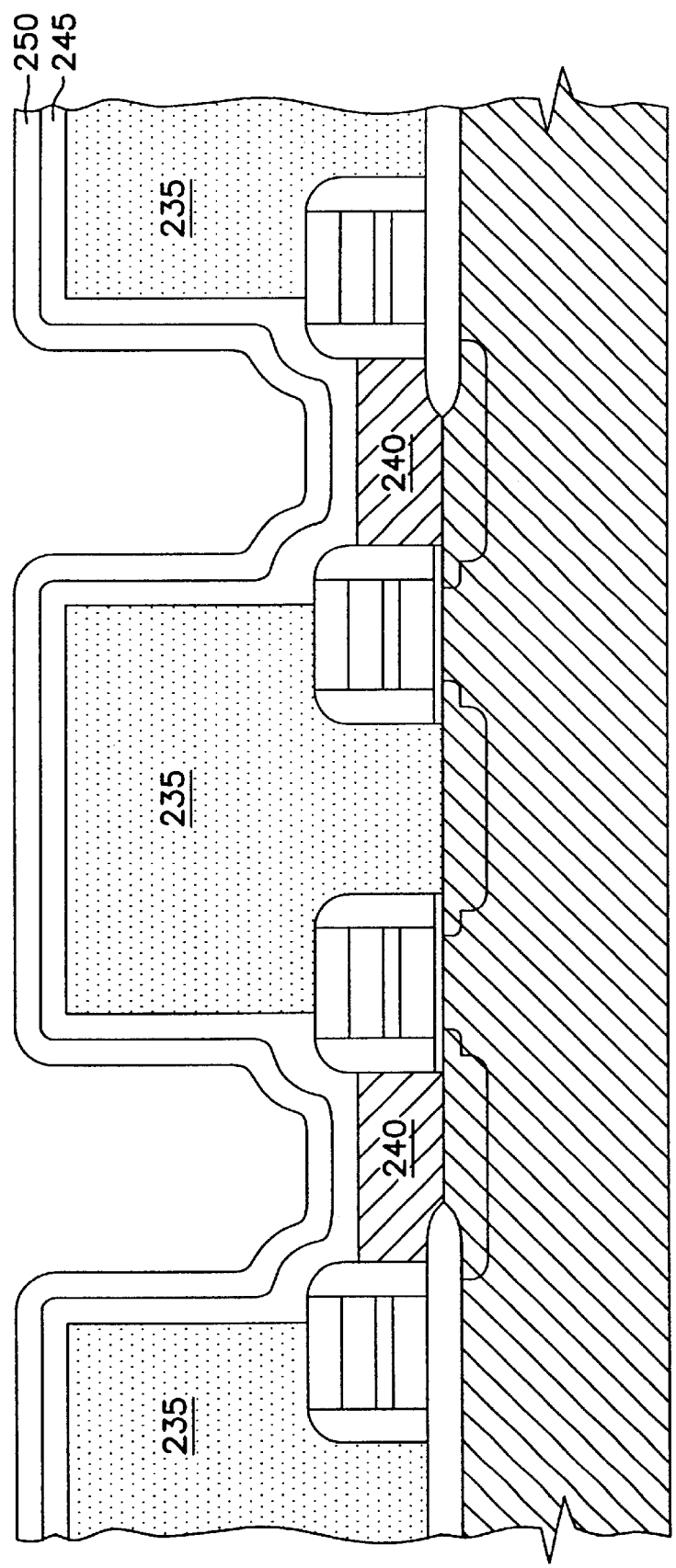

In FIG. 2F, a first barrier layer 250 is formed overlying the bottom electrode 245. The first barrier layer 250 is shown to be adjoining the bottom electrode 245, but there is no prohibition to forming additional conductive layers interposed between the first barrier layer 250 and the bottom electrode 245 described above. The first barrier layer 250 is a metal oxynitride material having a composition of the form $MO_xN_y$ where the metal component M is a refractory metal or a metal of the platinum metals group or the noble metals group. The refractory metals of chromium (Cr), cobalt (Co), hafnium (Hf), molybdenum (Mo), niobium (Nb), tantalum (Ta), titanium (Ti), tungsten (W), vanadium (V) and zirconium (Zr) are included in this definition. The metals of iridium (Ir), osmium (Os), palladium (Pd), platinum (Pt), rhodium (Rh) and ruthenium (Ru) are included in the platinum metals group. The metals of gold (Au), iridium, osmium, palladium, platinum, rhenium (Re), rhodium and ruthenium are included in the noble metals group. For one embodiment, first barrier layer 250 contains a tungsten oxynitride material ($WO_xN_y$). Metal oxynitrides can act as oxygen barriers to protect the underlying electrode from subsequent oxygen ambients or metal oxide dielectrics.

It is noted that the formulae $MO_xN_y$ and $WO_xN_y$ are not intended to represent a strict chemical structure, but rather a composite that on average contains x atoms of oxygen and y atoms of nitrogen for every one atom of the metal component. In general, for stoichiometric compounds, the maximum value of x is approximately equal to one-half the maximum valence of M while the maximum value of y is approximately equal to the maximum valence of M. It is noted, however, that formation of interstitial compounds permits increased values of x and y, where oxygen or nitrogen radicals, respectively, occupy spaces within the various crystal lattice structures of the metal oxynitride material. Furthermore, it is noted that, in stoichiometric compounds, increasing values of x will lead to decreasing values of y and vice versa. However, due to the lower minimum valence value of nitrogen, the magnitude of change in x will generally be smaller than the magnitude of change in y. Because $MO_xN_y$ and $WO_xN_y$ are representative of relative atomic ratios and not strict chemical structure, the values of x and y can be non-integer. Furthermore, while neither x nor y can equal zero, one or the other may approach zero.

Advantages of using metal oxynitride materials as a barrier layer include that the oxynitride can supply oxygen to a subsequently formed dielectric layer to prevent oxygen vacancy during subsequent thermal treatments. Additional benefits may be derived by matching the metal oxynitride barrier layer to a metal nitride electrode. Accordingly, the metal component of the metal oxynitride is selected to be the same as the metal component of the metal nitride. As an example, using a tungsten nitride bottom electrode 245, first barrier layer 250 would be selected to be $WO_xN_y$. Such matching of the barrier layer to the electrode can be utilized to reduce stress between the two layers, thus improving device reliability. Furthermore, as will be seen below, such matching allows formation of the bottom electrode 245 and the first barrier layer 250 using a single deposition process.

For one embodiment, x ranges from approximately zero to approximately one-half the maximum valence value of the metal component M and y ranges from approximately zero to approximately the maximum valence value of the metal component M. For another embodiment, x ranges from approximately 0.05 to approximately one-half the maximum valence value of the metal component M minus 0.05 and y ranges from approximately 0.1 to approximately the maximum valence value of the metal component M minus 0.1. As an example, for a metal component M having a maximum valence of 6, x would range from approximately 0.05 to approximately 2.95 and y would range from approximately 0.1 to approximately 5.9 for this embodiment. For still another embodiment, x ranges from approximately 0.05 to a value greater than one-half the maximum valence value of the metal component M and y ranges from approximately 0.1 to a value greater than the maximum valence value of the metal component M, thus forming an interstitial compound.

Conductivity may be altered by adjusting the nitrogen content relative to the oxygen content, given that metal oxynitrides having higher nitrogen contents are generally more conductive. It is preferred that the first barrier layer 250 exhibit conductivity because an insulative barrier layer creates a series capacitance of the barrier layer and the dielectric layer. Such series capacitance can detrimentally impact the overall capacitance of the capacitor structure when the insulative barrier layer has a dielectric constant less than that of the dielectric layer. For one embodiment, the first barrier layer 250 has a nitrogen content sufficient to provide a conductivity of at least approximately $10^{-4}$ (ohm-cm)$^{-1}$. For another embodiment, the first barrier layer 250 has a nitrogen content sufficient to provide a conductivity of at least approximately $10^{-2}$ (ohm-cm)$^{-1}$.

For one embodiment, the first barrier layer 250 is formed from the bottom electrode 245 containing metal nitride. For this embodiment, the metal nitride of the bottom electrode 245 may be oxidized or passivated to form the metal oxynitride. Such oxidation may use a variety of techniques including oxidation in an ambient containing NO, $N_2O$, $O_2$ or ozone ($O_3$), with or without the help of plasma, UV light or remote plasma, or an ambient containing $O_2$ plus $NH_3$. Controlled oxidation of the metal nitride can be used to form a passivation layer, i.e., the metal oxynitride first barrier layer 250, at the surface of the bottom electrode 245. For another embodiment, the first barrier layer 250 is deposited on the bottom electrode 245 such as by chemical vapor deposition (CVD) or plasma-enhanced chemical vapor deposition (PECVD). Using tungsten oxynitride as an example, techniques of depositing the tungsten oxynitride include using $WF_6$ in an oxygen- and nitrogen-containing ambient such as $N_2O$; $H_2$ plus $N_2O$; or $NH_3$ plus $O_2$ or ozone or $N_2O$. For a further embodiment, the first barrier layer 250 is deposited as an elemental metal layer, e.g., elemental tungsten, in a manner known in the art, followed by annealing in an oxygen- and nitrogen-containing ambient to convert the elemental metal to the metal oxynitride. Such CVD process may generally be carried out at a temperature of approximately 250° C. to approximately 650° C. Such PECVD processes may generally be carried out at a temperature of approximately 150° C. to approximately 550° C.

For one embodiment having a tungsten nitride bottom electrode 245, the first barrier layer 250 is formed by treating an exposed surface of the tungsten nitride with an ozone plasma. Metal-insulator-metal flat capacitor chips were prepared having a bottom electrode of CVD $WN_n$ with a thickness of approximately 450 Å. The dielectric layer of the test chips contained CVD $Ta_2O_5$ (tantalum oxide) with a thickness of approximately 80 Å. The top electrode of the test chips contained PVD TiN with a thickness of approximately 400 Å. The bottom electrode was treated with an ozone plasma at a chamber temperature of approximately 400° C. Summary results contained in Table 1 show the sheet resistance ($R_s$) of the bottom electrode versus treatment time. The summary results of Table 1 are considered representative of the testing described, but not guaranteed to be duplicated upon subsequent testing. However, the results are believed to support the conclusions drawn.

TABLE 1

Sheet Resistance vs. Ozone Plasma Treatment Time

| Treatment Time (seconds) | Sheet Resistance ($R_s$) (ohms/cm$^2$) |
|---|---|
| 0 | 520 |
| 30 | 560 |
| 60 | 564 |
| 120 | 576 |

As shown in Table 1, the sheet resistance of the tungsten nitride layer generally increases with the ozone plasma treatment time. However, the increase starts to saturate after approximately 30 seconds of treatment, indicating the formed passivation layer effectively reduces susceptibility to further oxidation. The overall increase after 120 seconds of treatment is on the order of 10% of the untreated sheet resistance, indicating that the formed passivation layer is relatively thin. Following formation of the tantalum oxide dielectric layer on the test chips, tungsten nitride bottom electrodes treated with ozone plasma demonstrated average leakage currents of approximately one to three orders of magnitude lower than as-deposited tungsten nitride electrodes.

Figure 2G:
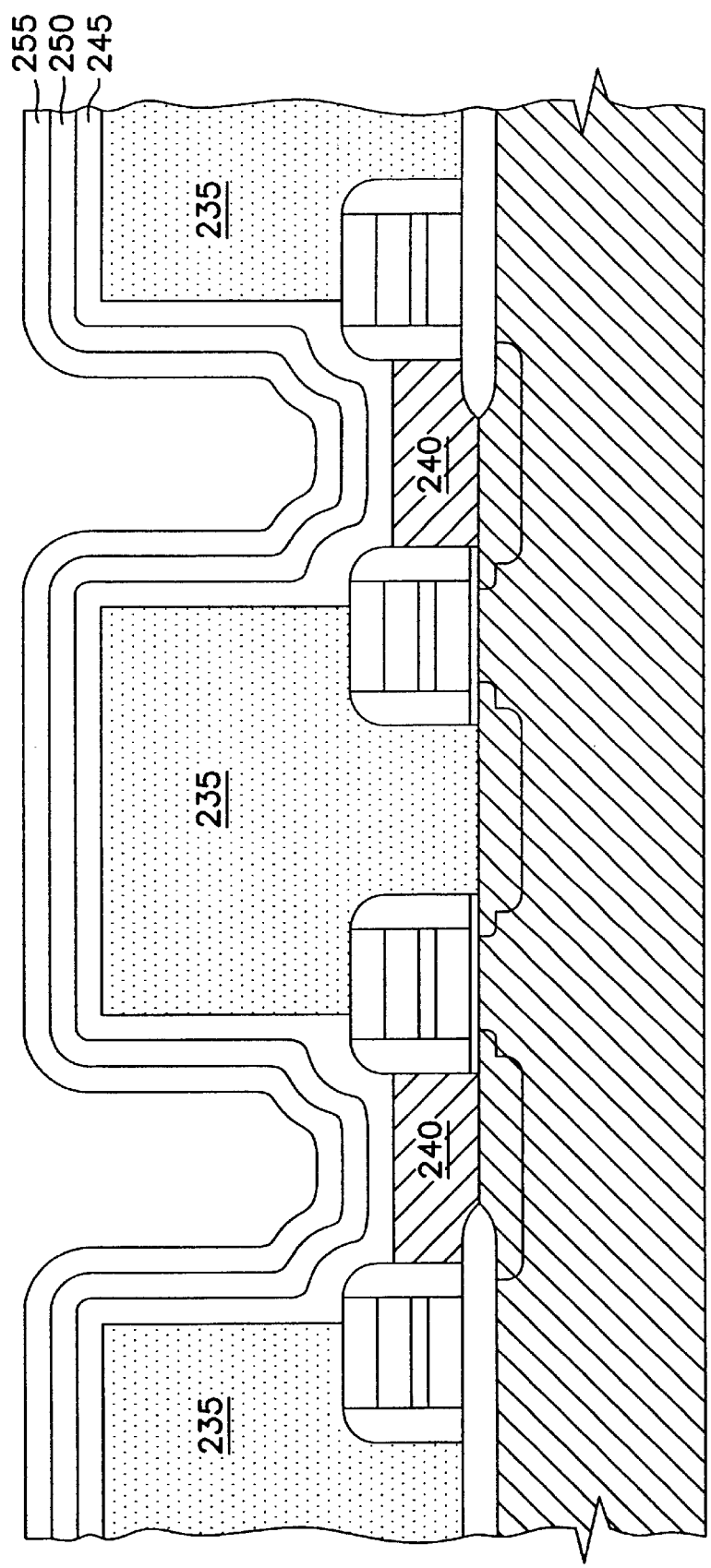

In FIG. 2G, a dielectric layer 255 is formed overlying the first barrier layer 250. The dielectric layer 255 is shown to be adjoining the first barrier layer 250, but there is no prohibition to forming additional layers interposed between the dielectric layer 255 and the first barrier layer 250 described above. Note, however, that the nature of any additional layer may adversely affect performance of the resulting capacitor such as creating an undesirable series capacitance.

Dielectric layer 255 contains a dielectric material. For one embodiment, dielectric layer 255 contains at least one metal oxide dielectric material. For another embodiment, dielectric layer 255 contains at least one dielectric material such as $Ba_zSr_{(1-z)}TiO_3$ [BST; where 0<z<1], $BaTiO_3$, $SrTiO_3$, $PbTiO_3$, $Pb(Zr,Ti)O_3$ [PZT], $(Pb,La)(Zr,Ti)O_3$ [PLZT], (Pb, La)$TiO_3$ [PLT], $Ta_2O_5$, $KNO_3$, $Al_2O_3$ or $LiNbO_3$. For a further embodiment, dielectric layer 255 contains $Ta_2O_5$. The dielectric layer 255 may be deposited by any deposition technique, e.g., RF-magnetron sputtering, chemical vapor deposition (CVD) or other suitable deposition technique. As one example, a metal oxide, e.g., tantalum oxide, may be formed by depositing a layer of the metal component, e.g., tantalum, followed by annealing in an oxygen-containing ambient. As another example, the metal oxide may be deposited by metal organic chemical vapor deposition (MOCVD). Subsequent to formation, dielectric layer 255 may be annealed in an oxygen-containing ambient, such as an ambient containing $O_2$ or ozone, at a temperature within the range of approximately 200 to 800° C. The actual oxygen-containing ambient, concentration of oxygen species and annealing temperature may vary for the specific dielectric deposited. These variations are well known to those skilled in the art.

While metal oxides are generally excellent dielectric materials, oxygen vacancy adversely affects their performance as dielectrics. Oxygen vacancy describes an oxygen content less than stoichiometric amounts, thus resulting in a metal-rich metal oxide. Metal-rich metal oxides tend to be conductive or leaky. Such effects from oxygen vacancies or deficiencies in tantalum oxide have been observed. A benefit of using the metal oxynitride barrier material is that it can provide extra oxygen to the dielectric material to repair oxygen vacancies, thus reducing or eliminating the need for post-formation annealing of the dielectric layer to repair oxygen vacancies. For one embodiment, post-formation annealing of the dielectric layer is eliminated.

The bottom electrode 245 is generally not oxidized, or is only marginally oxidized, during formation or subsequent processing of the dielectric layer 255 due to the protection from the oxygen-containing ambient and diffusion of oxygen as provided by first barrier layer 250.

Figure 2H:
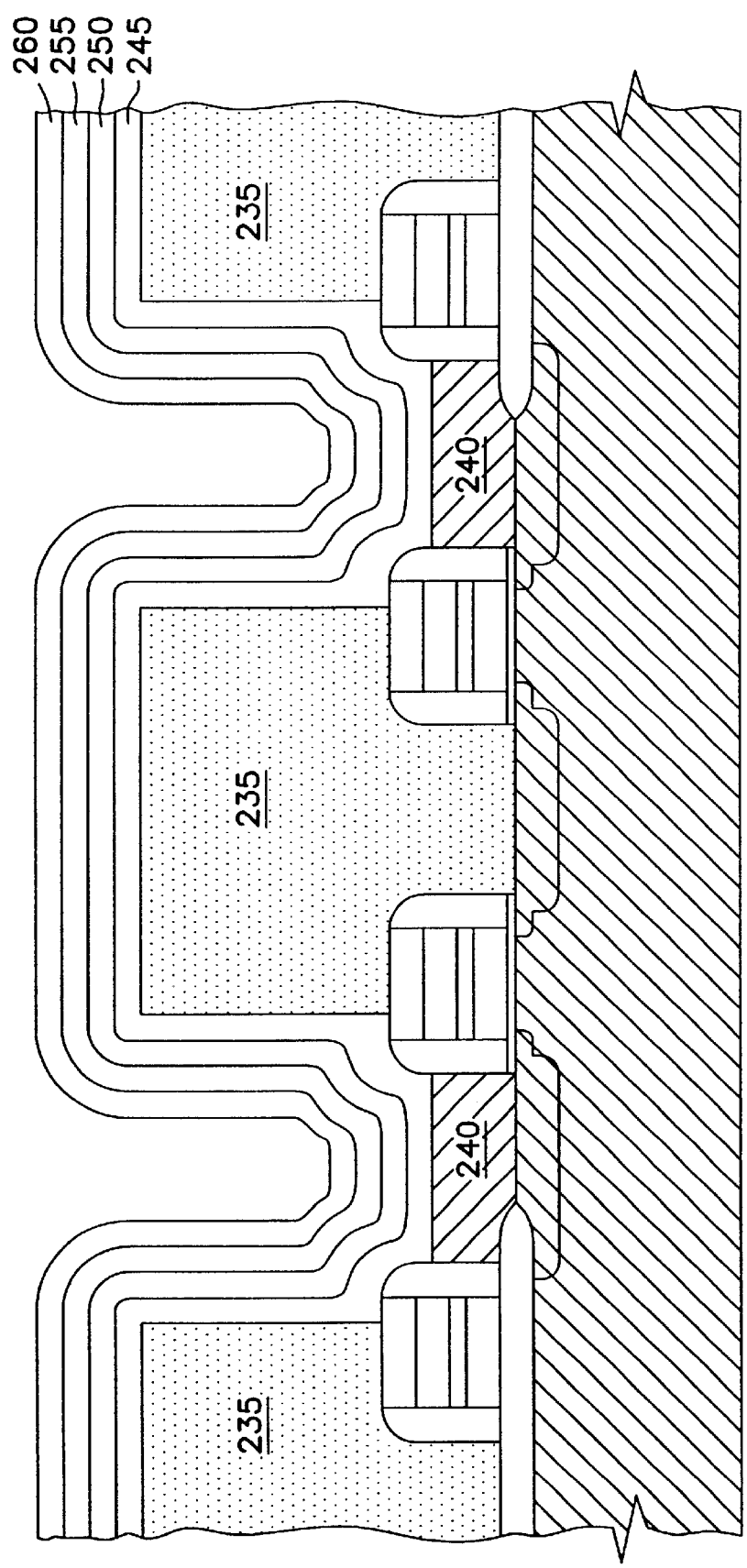
Figure 21:
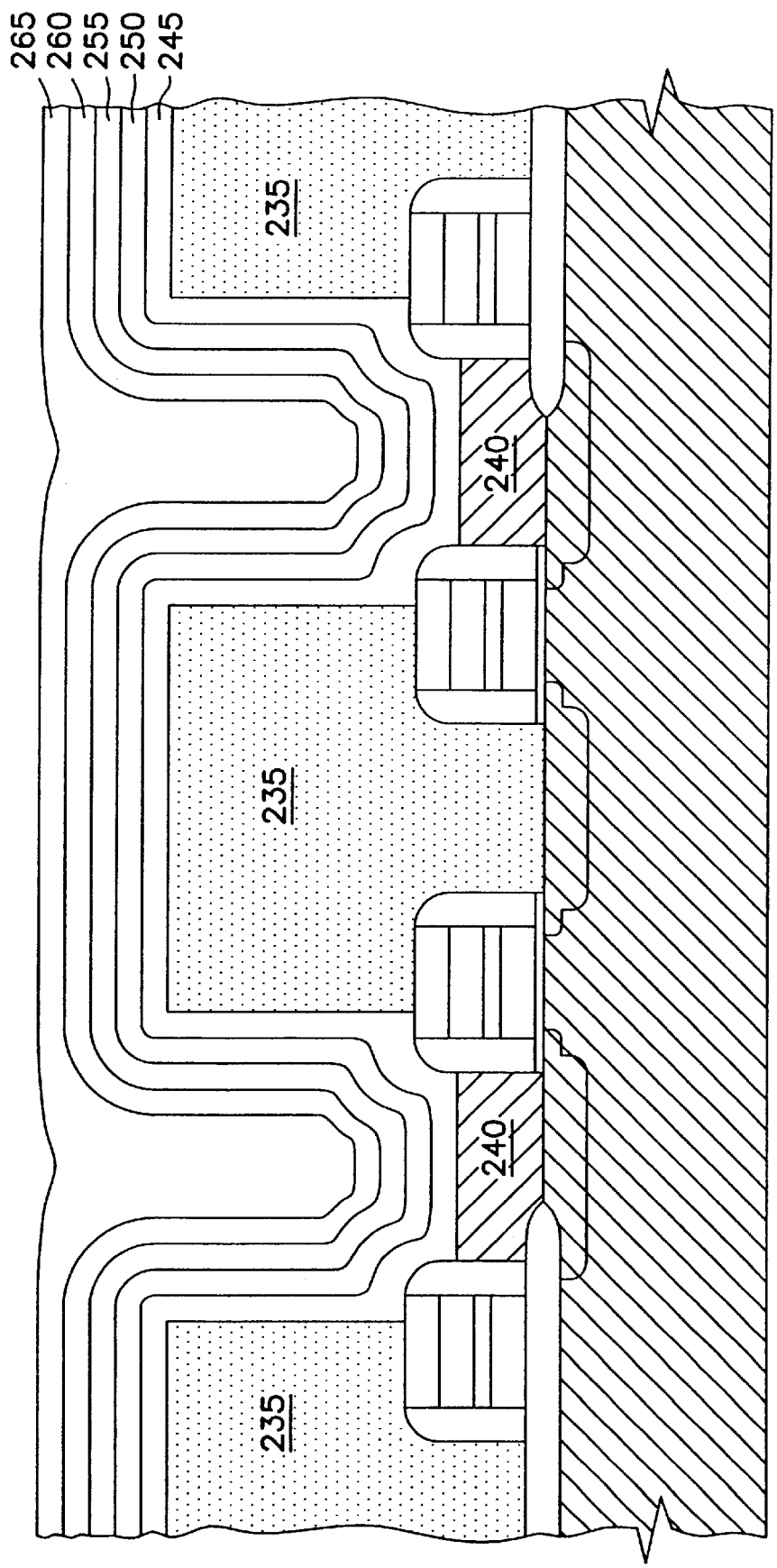
Figure 2J:
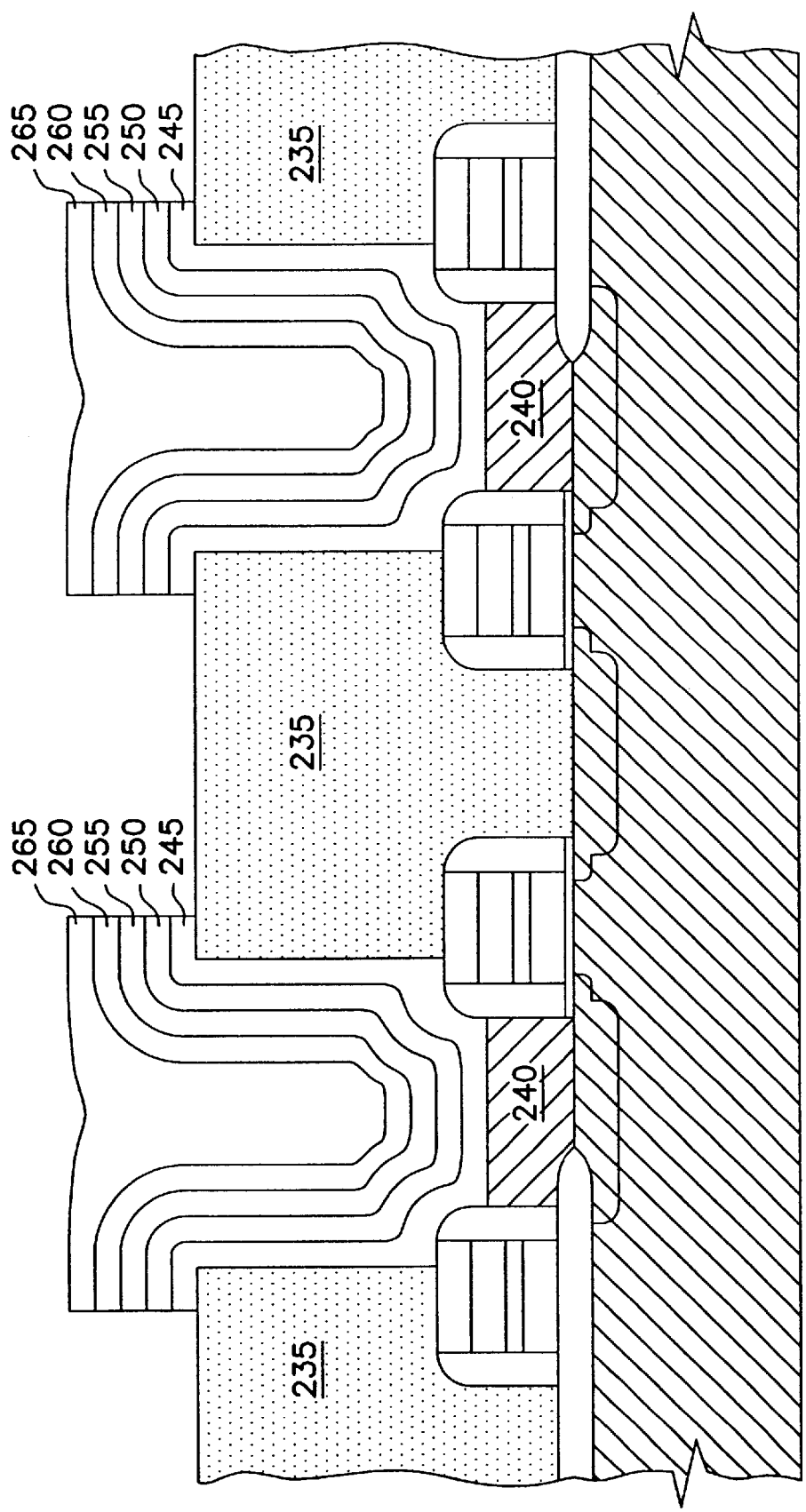

In FIG. 2H, a second barrier layer 260 is formed overlying the dielectric layer 255. The second barrier layer 260 is shown to be adjoining the dielectric layer 255, but there is no prohibition to forming additional layers interposed between the second barrier layer 260 and the dielectric layer 255 described above. Note, however, that the nature of any additional layer may adversely affect performance of the resulting capacitor such as creating an undesirable series capacitance.

The second barrier layer 260 is a metal oxynitride material having a composition of the form $MO_xN_y$ where the metal component M is a refractory metal. For one embodiment, first barrier layer 250 contains a tungsten oxynitride material ($WO_xN_y$). The definitions of M, x and y and other characteristics of the second barrier layer 260 follow the same guidelines as the first barrier layer 250. In addition, the techniques for forming the second barrier layer 260 generally follow the techniques for forming the first barrier layer 250. However, the construction of the second barrier layer 260 need not be identical or even substantially similar to the first barrier layer 250. For example, the first barrier layer 250 may have a composition of $WO_{2.1}N_{1.8}$ while the second barrier layer 260 may have a composition of $WO_{0.3}N_{5.4}$. Furthermore, a metal component M of the first barrier layer 250 need not be the same as a metal component M' of the second barrier layer 260. As an example, the first barrier layer 250 may have a composition of $WO_xN_y$ while the second barrier layer 260 may have a composition of $TiO_xN_y$.

In FIG. 2I, a top electrode 265 is deposited to form the top conductive layer or electrode of the capacitor. The top electrode 265 is shown to be adjoining the second barrier layer 260, but there is no prohibition to forming additional conductive layers interposed between the top electrode 265 and the second barrier layer 260 described above. Top electrode 265 may be of any conductive material and generally follows the same guidelines as bottom electrode 245. For one embodiment, top electrode 265 contains tungsten nitride. Layers 245 through 270 are then patterned by techniques known in the art to define capacitors of memory cells 200 in FIG. 2J.

In the foregoing embodiments, the capacitor structures included a barrier layer interposed between the dielectric layer and each electrode. An example from these embodiments includes a $WN_n/WO_xN_y/Ta_2O_5/WO_xN_y/WN_n$ structure for bottom electrode/barrier layer/dielectric layer/barrier layer/top electrode. However, there is no requirement to use barrier layers on each side of the dielectric layer. As an example, where the bottom electrode is not susceptible to oxidation, the first barrier layer could be eliminated. An example of this embodiment includes a $Pt/Ta_2O_5/WO_xN_y/WN_n$ structure for bottom electrode/dielectric layer/barrier layer/top electrode. Similarly, where the top electrode is not susceptible to oxidation, the second barrier layer could be eliminated.

In addition, the figures were used to aid the understanding of the accompanying text. However, the figures are not drawn to scale and relative sizing of individual features and layers are not necessarily indicative of the relative dimensions of such individual features or layers in application. As an example, while the bottom electrode 245 is drawn to have an illustrated thickness of approximately the same as the dielectric layer 255, for purposes of clarity and convenience, the bottom electrode 245 may have a physical thickness of five times that of the dielectric layer 255 in some applications. Accordingly, the drawings are not to be used for dimensional characterization.

While the foregoing embodiments of capacitor structures may be used in a variety of integrated circuit devices, they are particularly suited for use as storage capacitors of memory cells found in dynamic memory devices.

Memory Devices

Figure 3:
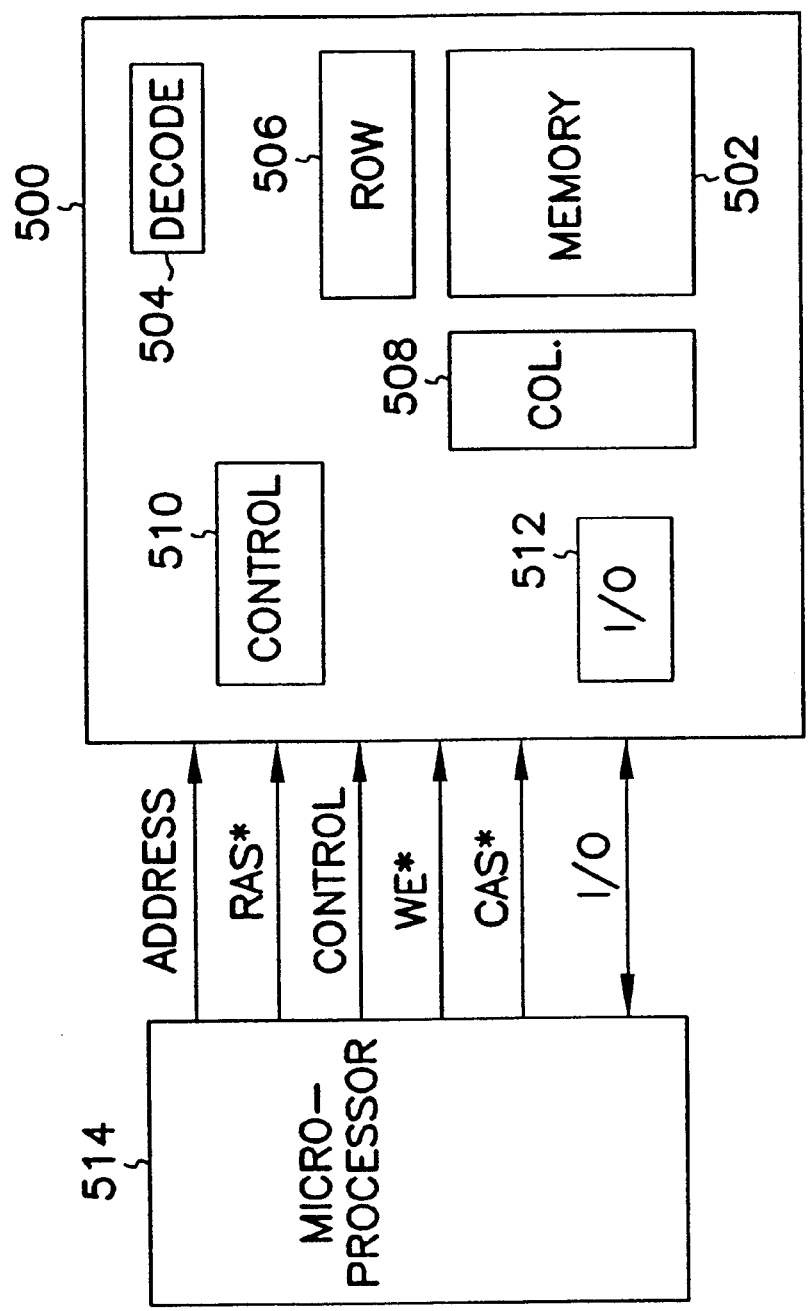
FIG. 3 is a block diagram of an integrated circuit memory device.

FIG. 3 is a simplified block diagram of a memory device according to one embodiment of the invention. The memory device 500 includes an array of memory cells 502, address decoder 504, row access circuitry 506, column access circuitry 508, control circuitry 510, and Input/Output circuit 512. The memory can be coupled to an external microprocessor 514, or memory controller for memory accessing. The memory receives control signals from the processor 514, such as WE*, RAS* and CAS* signals. The memory is used to store data which is accessed via I/O lines. It will be appreciated by those skilled in the art that additional circuitry and control signals can be provided, and that the memory device of FIG. 3 has been simplified to help focus on the invention. At least one of the memory cells or associated circuitry has a capacitor in accordance with the invention.

It will be understood that the above description of a DRAM (Dynamic Random Access Memory) is intended to provide a general understanding of the memory and is not a complete description of all the elements and features of a DRAM. Further, the invention is equally applicable to any size and type of memory circuit and is not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

Semiconductor Dies

Figure 4:
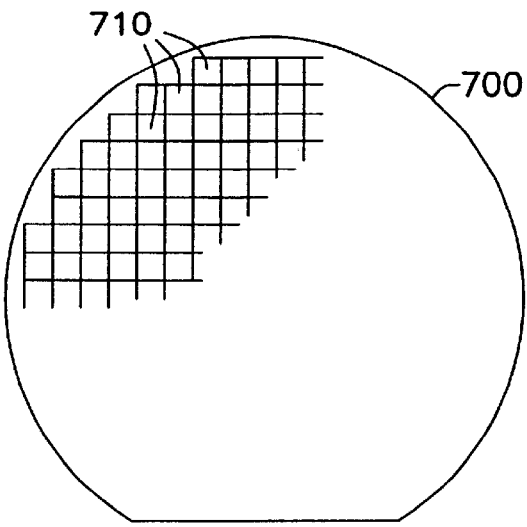
FIG. 4 is an elevation view of a wafer containing semiconductor dies.

With reference to FIG. 4, for one embodiment, a semiconductor die 710 is produced from a wafer 700. A die is an individual pattern, typically rectangular, on a substrate that contains circuitry, or integrated circuit devices, to perform a specific function. At least one of the integrated circuit devices contains a capacitor in accordance with the invention. A semiconductor wafer will typically contain a repeated pattern of such dies containing the same functionality. Die 710 may contain circuitry for the inventive memory device, as discussed above. Die 710 may further contain additional circuitry to extend to such complex devices as a monolithic processor with multiple functionality. Die 710 is typically packaged in a protective casing (not shown) with leads extending therefrom (not shown) providing access to the circuitry of the die for unilateral or bilateral communication and control.

Circuit Modules

Figure 5:
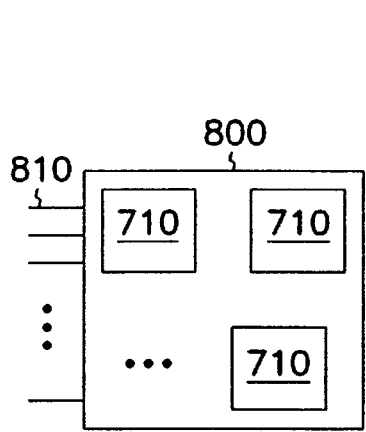
FIG. 5 is a block diagram of an exemplary circuit module.

As shown in FIG. 5, two or more dies 710 may be combined, with or without protective casing, into a circuit module 800 to enhance or extend the functionality of an individual die 710. Circuit module 800 may be a combination of dies 710 representing a variety of functions, or a combination of dies 710 containing the same functionality. One or more dies 710 of circuit module 800 contain at least one capacitor in accordance with the invention.

Some examples of a circuit module include memory modules, device drivers, power modules, communication modems, processor modules and application-specific modules, and may include multilayer, multichip modules. Circuit module 800 may be a subcomponent of a variety of electronic systems, such as a clock, a television, a cell phone, a personal computer, an automobile, an industrial control system, an aircraft and others. Circuit module 800 will have a variety of leads 810 extending therefrom and coupled to the dies 710 providing unilateral or bilateral communication and control.

Figure 6:
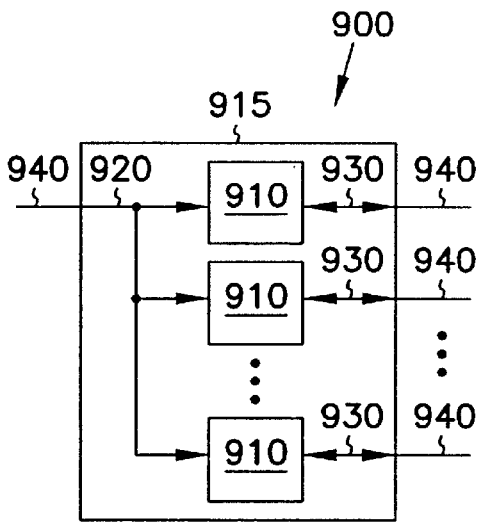
FIG. 6 is a block diagram of an exemplary memory module.

FIG. 6 shows one embodiment of a circuit module as memory module 900. Memory module 900 contains multiple memory devices 910 contained on support 915, the number generally depending upon the desired bus width and the desire for parity. Memory module 900 accepts a command signal from an external controller (not shown) on a command link 920 and provides for data input and data output on data links 930. The command link 920 and data links 930 are connected to leads 940 extending from the support 915. Leads 940 are shown for conceptual purposes and are not limited to the positions shown in FIG. 6.

Electronic Systems

Figure 7:
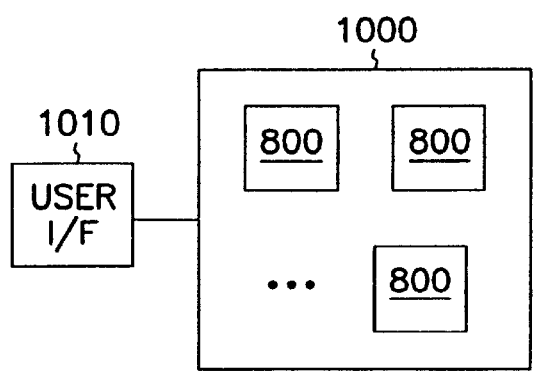
FIG. 7 is a block diagram of an exemplary electronic system.

FIG. 7 shows one embodiment of an electronic system 1000 containing one or more circuit modules 800. Electronic system 1000 generally contains a user interface 1010. User interface 1010 provides a user of the electronic system 1000 with some form of control or observation of the results of the electronic system 1000. Some examples of user interface 1010 include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. User interface 1010 may further describe access ports provided to electronic system 1000. Access ports are used to connect an electronic system to the more tangible user interface components previously exemplified. One or more of the circuit modules 800 may be a processor providing some form of manipulation, control or direction of inputs from or outputs to user interface 1010, or of other information either preprogrammed into, or otherwise provided to, electronic system 1000. As will be apparent from the lists of examples previously given, electronic system 1000 will often be associated with certain mechanical components (not shown) in addition to circuit modules 800 and user interface 1010.

It will be appreciated that the one or more circuit modules 800 in electronic system 1000 can be replaced by a single integrated circuit. Furthermore, electronic system 1000 may be a subcomponent of a larger electronic system.

Figure 8:
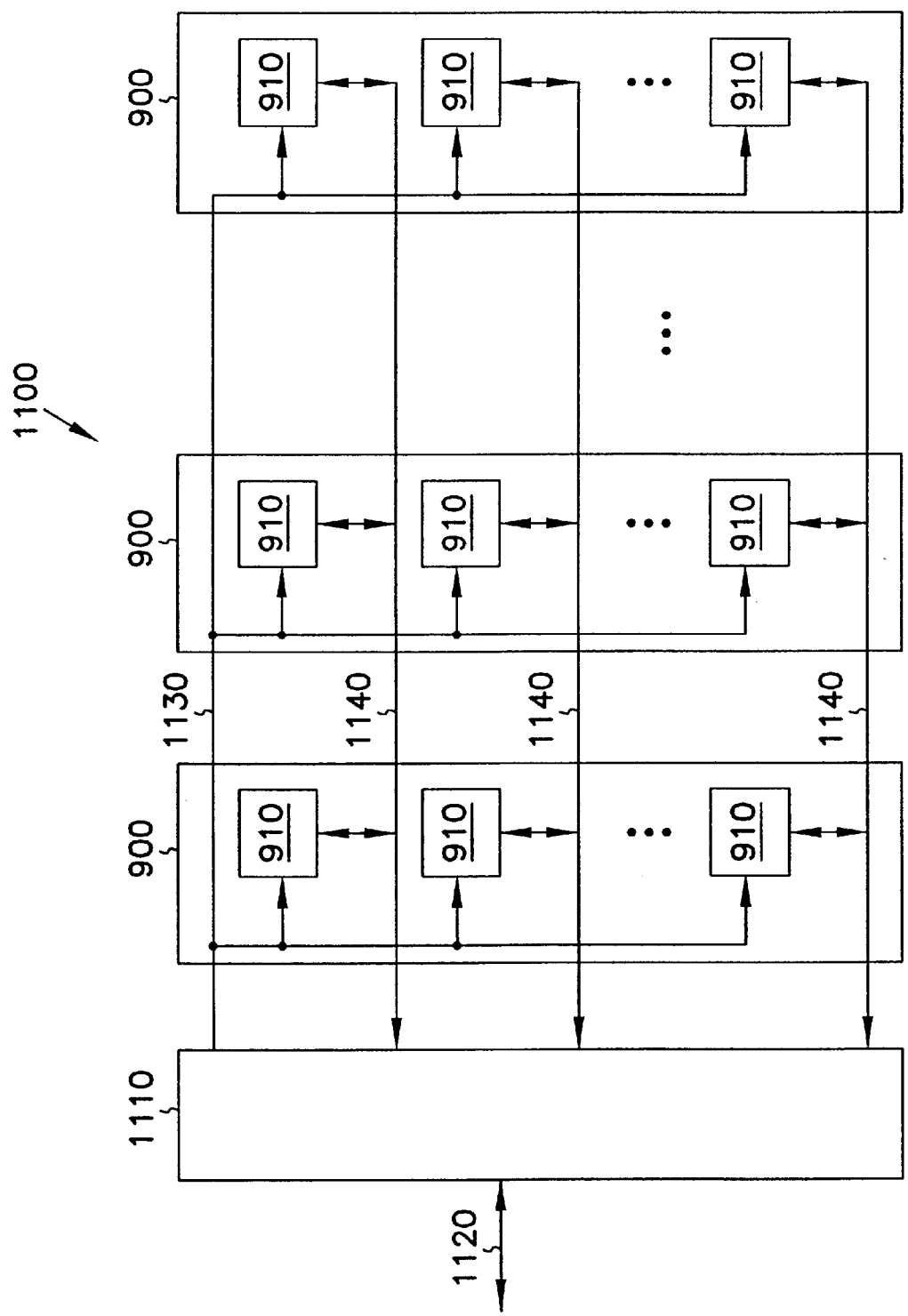
FIG. 8 is a block diagram of an exemplary memory system.

FIG. 8 shows one embodiment of an electronic system as memory system 1100. Memory system 1100 contains one or more memory modules 900 and a memory controller 1110. Memory controller 1110 provides and controls a bidirectional interface between memory system 1100 and an external system bus 1120. Memory system 1100 accepts a command signal from the external bus 1120 and relays it to the one or more memory modules 900 on a command link 1130. Memory system 1100 provides for data input and data output between the one or more memory modules 900 and external system bus 1120 on data links 1140.

Figure 9:
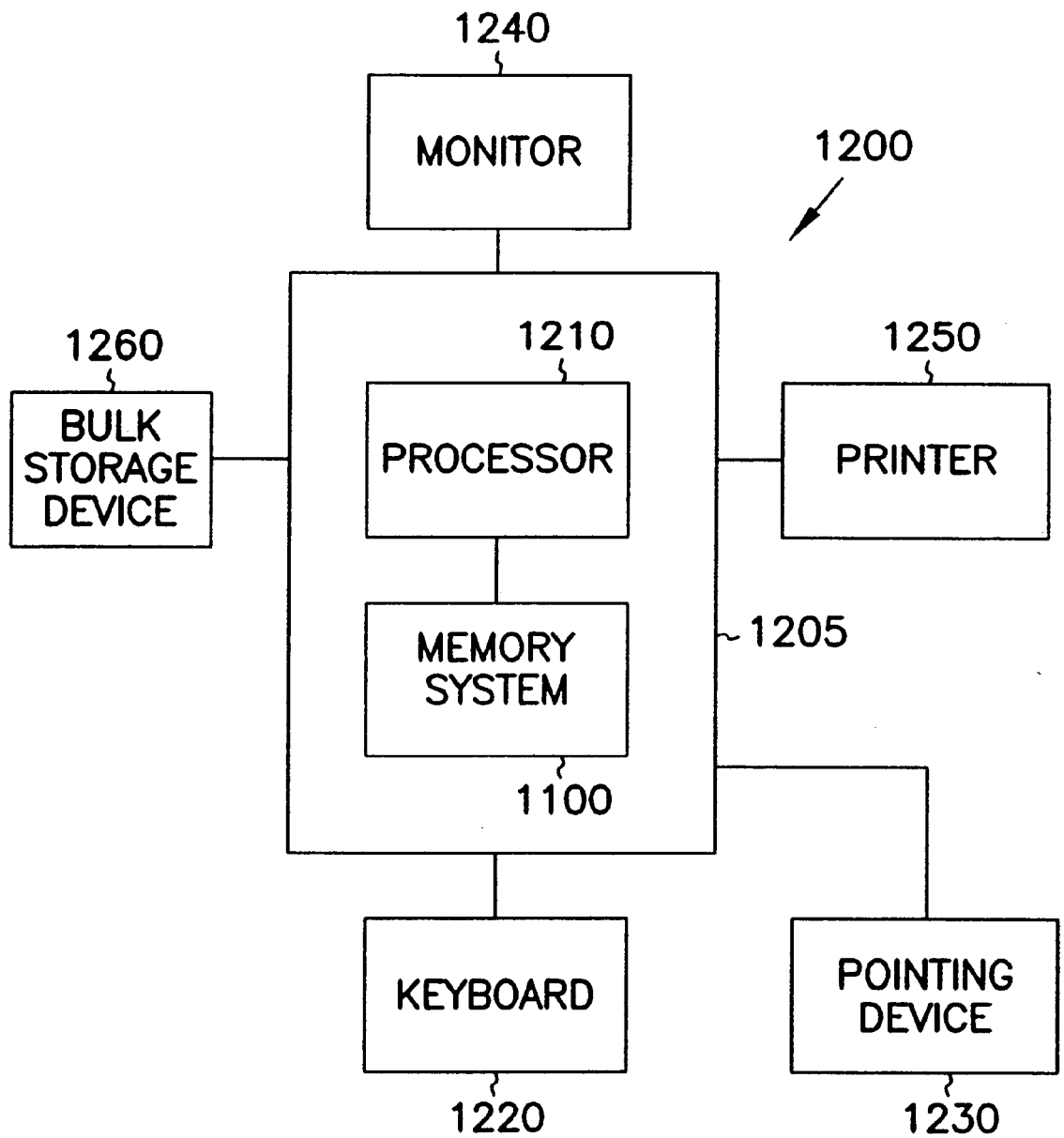
FIG. 9 is a block diagram of an exemplary computer system.

FIG. 9 shows a further embodiment of an electronic system as a computer system 1200. Computer system 1200 contains a processor 1210 and a memory system 1100 housed in a computer unit 1205. Computer system 1200 is but one example of an electronic system containing another electronic system, i.e., memory system 1100, as a subcomponent. Computer system 1200 optionally contains user interface components. Depicted in FIG. 9 are a keyboard 1220, a pointing device 1230, a monitor 1240, a printer 1250 and a bulk storage device 1260. It will be appreciated that other components are often associated with computer system 1200 such as modems, device driver cards, additional storage devices, etc. It will further be appreciated that the processor 1210 and memory system 1100 of computer system 1200 can be incorporated on a single integrated circuit. Such single package processing units reduce the communication time between the processor and the memory circuit.

Conclusion

Capacitor structures and methods of their manufacture have been described for use in integrated circuits. The capacitor structures include a bottom electrode, a top electrode and a dielectric layer interposed between the bottom electrode and the top electrode. The capacitor structures further include a metal oxynitride barrier layer interposed between the dielectric layer and at least one of the bottom and top electrodes. Each metal oxynitride barrier layer acts to reduce undesirable oxidation of its associated electrode. Each metal oxynitride barrier layer can further aid in the repairing of oxygen vacancies in a metal oxide dielectric. The capacitors are suited for use in memory cells and apparatus incorporating such memory cells, as well as in other integrated circuits.

Capacitors may be subjected to oxidizing ambients, especially where the dielectric requires formation of a metal oxide layer. The oxidizing ambients may diffuse oxygen to the bottom electrode of the capacitor. Furthermore, metal oxide dielectrics may lead to oxidation of either electrode through direct contact. Metal oxynitrides function as oxygen barriers to reduce the oxidation of the capacitor electrodes by eliminating direct contact with the dielectric layer and by reducing oxygen diffusion to the electrode. Metal oxynitrides for use as barrier layers in the various embodiments of the invention are formulated to be conductive. Non-conductive barrier layers can adversely affect the overall capacitance by creating a series capacitance of the barrier layer and the dielectric layer. Metal oxynitrides further may provide extra oxygen to metal oxide dielectrics to repair oxygen deficiencies, thus improving the performance of the metal oxide dielectric. The various embodiments of the invention provide structures and methods to reduce oxidation of capacitor electrodes from contact with a metal oxide dielectric layer or from oxidizing ambients used in the formation or subsequent processing of the metal oxide dielectric layer.

While the invention has been described and illustrated with respect to forming container capacitors for a memory cell, it should be apparent that substantially similar processing techniques can be used to form other container capacitors for other applications as well as other capacitor structures. As one example, capacitors formed in accordance with the methods described herein may be used as on-chip capacitors utilized to reduce lead impedance of a packaged integrated circuit chip. As further example, parallel plate or trench capacitors may be formed with a metal oxynitride barrier layer between a metal oxide dielectric layer and an electrode.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. For example, other materials and shapes, as well as other deposition and removal processes, may be utilized in conjunction with the invention. Accordingly, this application is intended to cover any adaptations or variations of the invention. It is manifestly intended that this invention be limited only by the following claims and equivalents thereof.

What is claimed is:

1. A method of forming a capacitor, comprising:
   forming an insulating layer on a substrate;
   forming an opening in the insulating layer, wherein the opening has a bottom portion overlying an exposed portion of the substrate and sidewall portions defined by the insulating layer;
   forming a bottom electrode layer overlying the insulating layer, the exposed portion of the substrate and the sidewall portions;
   depositing a first metal oxynitride baffler layer overlying the bottom electrode layer;
   forming a dielectric layer overlying the first metal oxynitride baffler layer;
   depositing a second metal oxynitride baffler layer overlying the dielectric layer;
   forming a top electrode layer overlying the second metal oxynitride baffler layer; and
   patterning the top electrode layer, second metal oxynitride baffler layer, dielectric layer, first metal oxynitride barrier layer and bottom electrode layer, thereby defining the capacitor.

2. The method of claim 1, wherein forming each electrode layer comprises forming a layer of metal nitride.

3. The method of claim 1, wherein forming each electrode layer comprises forming a layer of tungsten nitride.

4. The method of claim 1, wherein depositing each metal oxynitride baffler layer individually comprises forming a layer of metal oxynitride having a composition of the form $MO_xN_y$, wherein M is a metal component selected from the group consisting of chromium, cobalt, hafnium, iridium, molybdenum, niobium, osmium, rhenium, rhodium, ruthenium, tantalum, titanium, tungsten, vanadium and zirconium.

5. The method of claim 4, wherein the metal component of the first metal oxynitride barrier layer is the same as the metal component of the second metal oxynitride baffler layer.

6. The method of claim 4, wherein x ranges from approximately 0.05 to approximately one-half the maximum valence value of the metal component M minus 0.05 and y ranges from approximately 0.1 to approximately the maximum valence value of the metal component M minus 0.1.

7. The method of claim 4, wherein each metal oxynitride baffler layer comprises a tungsten oxynitride having a composition of the form $WO_xN_y$, wherein x ranges from approximately 0.05 to approximately 2.95 and y ranges from approximately 0.1 to approximately 5.9.

8. The method of claim 1, wherein the forming a dielectric layer comprises forming a dielectric layer comprising at least one metal oxide dielectric material selected from the group consisting of $Ba_zSr_{(1-z)}TiO_3$, (where 0<z<1), $BaTiO_3$, $SrTiO_3$, $PbTiO_3$, $Pb(Zr,Ti)O_3$, $(Pb,La)(Zr,Ti)O_3$, $(Pb,La)TiO_3$, $Ta_2O_5$, $KNO_3$, $Al_2O_3$ and $LiNbO_3$.

9. The method of claim 1, wherein the method is performed in the order presented.

10. A method of forming a capacitor, comprising:
forming an insulating layer on a substrate;
forming an opening in the insulating layer, wherein the opening has a bottom portion overlying an exposed portion of the substrate and sidewall portions defined by the insulating layer;
forming a bottom electrode layer overlying the insulating layer, the exposed portion of the substrate and the sidewall portions;
depositing a metal oxynitride barrier layer overlying the bottom electrode;
forming a dielectric layer overlying the first metal oxynitride barrier layer;
forming a top electrode layer overlying the dielectric layer; and patterning the top electrode layer, dielectric layer, metal oxynitride barrier layer and bottom electrode layer, thereby defining the capacitor.

11. The method of claim 10, wherein the method is performed in the order presented.

12. A method of forming a capacitor, comprising:
forming an insulating layer on a substrate;
forming an opening in the insulating layer, wherein the opening has a bottom portion overlying an exposed portion of the substrate and sidewall portions defined by the insulating layer;
forming a bottom electrode layer overlying the insulating layer, the exposed portion of the substrate and the sidewall portions;
forming a dielectric layer overlying the bottom electrode layer;
depositing a metal oxynitride barrier layer overlying the dielectric layer;
forming a top electrode layer overlying the metal oxynitride barrier layer; and
patterning the top electrode layer, metal oxynitride barrier layer, dielectric layer and bottom electrode layer, thereby defining the capacitor.

13. The method of claim 12, wherein the method is performed in the order presented.

14. A method of forming a capacitor, comprising:
forming a bottom electrode layer;
depositing a first tungsten oxynitride barrier layer overlying the bottom electrode layer;
forming a dielectric layer overlying the first tungsten oxynitride baffler layer;
depositing a second tungsten oxynitride barrier layer overlying the dielectric layer; and
forming a top electrode layer overlying the second tungsten oxynitride baffler layer.

15. A method of forming a capacitor, comprising:
forming-a bottom electrode layer;
depositing a tungsten oxynitride baffler layer overlying the bottom electrode layer;
forming a dielectric layer overlying the tungsten oxynitride baffler layer; and
forming a top electrode layer overlying the dielectric layer.

16. A method of forming a capacitor, comprising:
forming a bottom electrode layer;
forming a dielectric layer overlying the bottom electrode layer;
depositing a tungsten oxynitride baffler layer overlying the dielectric layer; and
forming a top electrode layer overlying the tungsten oxynitride baffler layer.

17. A method of forming a capacitor, comprising:
forming a bottom electrode layer, wherein the bottom electrode layer comprises a metal nitride having a metal component;
depositing a first metal oxynitride baffler layer overlying the bottom electrode layer, wherein the first metal oxynitride baffler layer comprises a metal oxynitride having a composition of the form $MO_xN_y$, wherein M is a metal component selected from the group consisting of chromium, cobalt, hathium, iridium, molybdenum, niobium, osmium, rhenium, rhodium, ruthenium, tantalum, titanium, tungsten, vanadium and zirconium;
forming a metal oxide dielectric layer overlying the first metal oxynitride baffler layer;
depositing a second metal oxynitride baffler layer overlying the dielectric layer, wherein the second metal oxynitride baffler layer comprises a metal oxynitride having a composition of the form $M'O_{x'}N'_{y'}$, wherein M' is a metal component selected from the group consisting of chromium, cobalt, hafnium, iridium, molybdenum, niobium, osmium, rhenium, rhodium, ruthenium, tantalum, titanium, tungsten, vanadium and zirconium;
forming a top electrode layer overlying the second metal oxynitride barrier layer, wherein the top electrode layer comprises a metal nitride having a metal component; and
patterning the top electrode layer, second metal oxynitride barrier layer, dielectric layer, first metal oxynitride barrier layer and bottom electrode layer, thereby defining the capacitor.

18. The method of claim 17, wherein the metal component of each electrode layer is tungsten.

19. The method of claim 17, wherein the metal component M of the first metal oxynitride barrier layer is selected to be the same as the metal component of the bottom electrode layer.

20. The method of claim 17, wherein the metal component M' of the second metal oxynitride baffler layer is selected to be the same as the metal component of the top electrode layer.

21. The method of claim 17, wherein the metal component M of the first metal oxynitride baffler layer is the same as the metal component M' of the second metal oxynitride baffler layer.

22. The method of claim 17, wherein x and x' each independently range from approximately 0.05 to approximately one-half the maximum valence value of their respective metal component minus 0.05, and y and y' each independently range from approximately 0.1 to approximately the maximum valence value of their respective metal component minus 0.1.

23. The method of claim 17, wherein the forming a metal oxide dielectric layer comprises forming a dielectric layer comprising at least one metal oxide dielectric material selected from the group consisting of $Ba_zSr_{(1-z)}TiO_3$, (where $0<z<1$), $BaTiO_3$, $SrTiO_3$, $PbTiO_3$, $Pb(Zr,Ti)O_3$, $(Pb,La)(Zr,Ti)O_3$, $(Pb,La)TiO_3$, $Ta_2O_5$, $KNO_3$, $Al_2O_3$ and $LiNbO_3$.

24. The method of claim 17, wherein the method is performed in the order presented.

25. A method of forming a capacitor, comprising:
   forming a bottom electrode layer;
   depositing a first metal oxynitride barrier layer overlying the bottom electrode layer;
   forming a dielectric layer overlying the first metal oxynitride barrier layer;
   depositing a second metal oxynitride barrier layer overlying the dielectric layer;
   and forming a top electrode layer overlying the second metal oxynitride barrier layer.

26. The method of claim 25, further comprising patterning the top electrode layer, the second metal oxynitride barrier layer, the dielectric layer, the first metal oxynitride barrier layer and the bottom electrode layer to define the capacitor.

27. The method of claim 25, wherein the method is performed in the order presented.

28. A method of forming a capacitor, comprising:
   forming a bottom electrode layer;
   depositing a metal oxynitride barrier layer overlying the bottom electrode layer;
   forming a dielectric layer overlying the metal oxynitride barrier layer; and
   forming a top electrode layer overlying the dielectric layer.

29. The method of claim 28, wherein the method is performed in the order presented.

30. A method of forming a capacitor, comprising:
   forming a bottom electrode layer;
   forming a dielectric layer overlying the bottom electrode layer;
   depositing a metal oxynitride barrier layer overlying the dielectric layer; and
   forming a top electrode layer overlying the metal oxynitride baffler layer.

31. The method of claim 30, wherein the method is performed in the order presented.

32. A method of forming a capacitor, comprising:
   forming a bottom electrode layer comprising a metal nitride;
   depositing a metal oxynitride passivation layer on the bottom electrode layer;
   forming a dielectric layer on the metal oxynitride passivation layer;
   forming a top electrode layer overlying the dielectric layer; and
   patterning the top electrode layer, dielectric layer, metal oxynitride passivation layer and bottom electrode layer, thereby defining the capacitor.

33. The method of claim 32, further comprising forming a metal oxynitride barrier layer interposed between the dielectric layer and the top electrode layer.

34. The method of claim 32, wherein forming a top electrode layer comprises forming a layer of metal nitride.

35. The method of claim 32, wherein the method is performed in the order presented.

36. A method of forming a capacitor, comprising:
   forming a bottom electrode layer comprising a metal nitride;
   depositing a metal oxynitride passivation layer on the bottom electrode layer;
   forming a tantalum oxide dielectric layer on the metal oxynitride passivation layer;
   forming a top electrode layer overlying the dielectric layer; and
   patterning the top electrode layer, dielectric layer, metal oxynitride passivation layer and bottom electrode layer, thereby defining the capacitor.

37. The method of claim 36, wherein the method is performed in the order presented.

38. A method of forming a capacitor, comprising:
   forming a bottom electrode layer comprising a tungsten nitride;
   depositing a tungsten oxynitride passivation layer on the bottom electrode layer;
   forming a dielectric layer on the tungsten oxynitride passivation layer;
   forming a top electrode layer overlying the dielectric layer; and
   patterning the top electrode layer, dielectric layer, tungsten oxynitride passivation layer and bottom electrode layer, thereby defining the capacitor.

39. The method of claim 38, further comprising forming a metal oxynitride barrier layer interposed between the dielectric layer and the top electrode layer.

40. The method of claim 38, wherein the method is performed in the order presented.

41. A method of forming a capacitor, comprising:
   forming a bottom electrode layer comprising a tungsten nitride;
   depositing a tungsten oxynitride passivation layer on the bottom electrode layer;
   forming a tantalum oxide layer on the tungsten oxynitride passivation layer;
   forming a top electrode layer overlying the tantalum oxide layer; and
   patterning the top electrode layer, tantalum oxide layer, tungsten oxynitride passivation layer and bottom electrode layer, thereby defining the capacitor.

42. The method of claim 41, further comprising forming a metal oxynitride barrier layer interposed between the tantalum oxide layer and the top electrode layer.

43. The method of claim 41, wherein the method is performed in the order presented.

* * * * *

UNITED STATES PATENT AND TRADEMARK OFFICE
CERTIFICATE OF CORRECTION

PATENT NO. : 6,670,256 B2  
DATED : December 30, 2003  
INVENTOR(S) : Yang et al.

It is certified that error appears in the above-identified patent and that said Letters Patent is hereby corrected as shown below:

Title page,
Item [56], References Cited, under U.S. PATENT DOCUMENTS, delete
"Wolters et al." and insert -- Woltors et al. --, therefor.
Under OTHER PUBLICATIONS, delete "BaTi03" and insert -- $BaTiO_3$ --, therefor.
delete "(Ba, Sr)TiO3" and insert -- $(Ba, Sr)TiO_3$ --, therefor.
delete "RuO2" and insert -- $RuO_2$ --, therefor.

Column 6,
Line 67, delete "than" and insert -- that --, therefor.

Column 14,
Lines 37, 40, 41, 45, 47, 55 and 64, delete "baffler" and insert -- barrier --, therefor.

Column 15,
Lines 5, 63 and 67, delete "baffler" and insert -- barrier --, therefor.

Column 16,
Line 2, delete "forming-a" and insert -- forming a --, therefor.
Lines 3, 6, 14, 17, 23, 25, 33, 34, 36, 58, 62 and 63, delete "baffler" and insert
-- barrier --, therefor.
Line 28, delete "hathium" and insert -- hafnium --, therefor.
Line 37, delete "M'O$_x$'N'$_y$" and insert -- $M'O_{x'}N_{y'}$ --, therefor.

Signed and Sealed this

Thirteenth Day of April, 2004

JON W. DUDAS  
*Acting Director of the United States Patent and Trademark Office*